United States Patent
North et al.

(10) Patent No.: US 11,262,820 B1
(45) Date of Patent: Mar. 1, 2022

(54) INFORMATION HANDLING SYSTEM DYNAMIC THERMAL BEHAVIOR

(71) Applicant: Dell Products L.P., Round Rock, TX (US)

(72) Inventors: Travis C. North, Cedar Park, TX (US); Jace W. Files, Round Rock, TX (US); John Trevor Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/113,514

(22) Filed: Dec. 7, 2020

(51) Int. Cl.
| | | |
|---|---|---|
| G06F 1/20 | (2006.01) | |
| G06F 1/16 | (2006.01) | |
| H05K 7/20 | (2006.01) | |
| H05K 5/02 | (2006.01) | |

(52) U.S. Cl.
CPC ............ *G06F 1/203* (2013.01); *G06F 1/1616* (2013.01); *G06F 1/206* (2013.01); *H05K 5/023* (2013.01); *H05K 5/0226* (2013.01); *H05K 7/20172* (2013.01); *H05K 7/20209* (2013.01); *H05K 7/20336* (2013.01)

(58) Field of Classification Search
CPC . G06F 1/20; G06F 1/203; G06F 1/206; G06F 1/1616; G06F 1/1601; G06F 1/1613; H05K 7/20209; H05K 7/20409; H05K 5/0226; H05K 5/023; H05K 7/20336; H05K 7/20172; H05K 5/0017; H05K 7/20136; H05K 7/20
See application file for complete search history.

(56) References Cited

U.S. PATENT DOCUMENTS

| | | | |
|---|---|---|---|
| 6,023,402 A | | 2/2000 | Kaminski |
| 6,115,883 A | * | 9/2000 | Um ...................... G06F 1/1656 16/405 |
| 6,415,612 B1 | | 7/2002 | Pokharna et al. |
| 6,631,755 B1 | | 10/2003 | Kung et al. |
| 6,695,041 B2 | | 2/2004 | Lai |
| 6,924,978 B2 | | 8/2005 | Distefano |
| 7,151,837 B2 | | 12/2006 | Bank et al. |
| 7,350,011 B2 | | 3/2008 | Keely et al. |
| 8,063,887 B2 | | 11/2011 | Barrus et al. |
| 8,166,412 B2 | | 4/2012 | Jain et al. |
| 8,644,550 B2 | | 2/2014 | Basson et al. |

(Continued)

FOREIGN PATENT DOCUMENTS

| | | |
|---|---|---|
| AU | 2008264803 A1 | 12/2008 |
| EP | 2364005 B1 | 9/2011 |

(Continued)

*Primary Examiner* — Michael A Matey
(74) *Attorney, Agent, or Firm* — Zagorin Cave LLP; Robert W. Holland

(57) ABSTRACT

A portable information handling system manages thermal conditions of an external surface based upon context that indicates user presence versus use in a standalone mode, such as based upon movements sensed by an accelerometer, touches sensed by a capacitive sensor, and the rotational orientation of the system housing. In one embodiment, a motorized hinge varies a time to close the housing so that the housing external surface cools sufficiently for an end user touch. A color coded light illuminates that the housing to provide the end user a visual indication of the housing temperature.

17 Claims, 19 Drawing Sheets

(56) References Cited

U.S. PATENT DOCUMENTS

| | | | |
|---|---|---|---|
| 8,667,473 | B2 | 3/2014 | Goossen et al. |
| 8,891,231 | B2 * | 11/2014 | Okuley .................. G06F 1/1616 |
| | | | 361/679.26 |
| 8,996,331 | B2 | 3/2015 | Anderson et al. |
| 9,155,405 | B2 | 10/2015 | Artwohl et al. |
| 9,195,829 | B1 | 11/2015 | Goradia et al. |
| 9,477,317 | B1 | 10/2016 | Clements |
| 9,671,171 | B2 | 6/2017 | Xiang |
| 9,823,631 | B1 * | 11/2017 | Loo ......................... G05B 15/02 |
| 9,965,035 | B2 | 5/2018 | Santamaria et al. |
| 10,120,418 | B2 | 11/2018 | Lee et al. |
| 10,253,804 | B2 * | 4/2019 | Park ....................... G06F 1/1681 |
| 10,401,926 | B1 | 9/2019 | North |
| 10,417,943 | B2 | 9/2019 | Dunn |
| 10,551,888 | B1 * | 2/2020 | North ...................... G06F 1/203 |
| 10,558,244 | B1 * | 2/2020 | Brocklesby ........... H02G 11/003 |
| 10,564,677 | B2 | 2/2020 | Lee |
| 10,579,112 | B2 | 3/2020 | North |
| 10,579,113 | B2 | 3/2020 | North |
| 10,606,311 | B2 * | 3/2020 | Shindo ................. G06F 1/1637 |
| 10,635,132 | B1 * | 4/2020 | Brocklesby ........... G06F 1/1683 |
| 10,802,555 | B2 * | 10/2020 | North ................. H05K 7/20381 |
| 10,802,556 | B2 | 10/2020 | North |
| 10,936,031 | B2 | 3/2021 | North |
| 10,969,841 | B2 | 4/2021 | North |
| 10,976,780 | B2 * | 4/2021 | Urimoto ............... G06F 1/1654 |
| 2004/0246428 | A1 | 12/2004 | Shirato |
| 2005/0103477 | A1 | 5/2005 | Kim et al. |
| 2006/0078423 | A1 | 4/2006 | Zheng |
| 2010/0301717 | A1 * | 12/2010 | Wang ..................... G06F 1/1656 |
| | | | 312/223.1 |
| 2013/0163201 | A1 * | 6/2013 | Wang ..................... B23P 11/00 |
| | | | 361/692 |
| 2013/0201617 | A1 * | 8/2013 | Tsai ....................... G06F 1/1616 |
| | | | 361/679.4 |
| 2013/0300978 | A1 | 11/2013 | Yang et al. |
| 2015/0199955 | A1 | 7/2015 | Draganic |
| 2016/0316301 | A1 | 10/2016 | Chen |
| 2017/0303048 | A1 | 10/2017 | Hooton et al. |
| 2017/0366898 | A1 | 12/2017 | Melanson et al. |
| 2018/0101197 | A1 | 4/2018 | Barnett et al. |
| 2018/0203658 | A1 * | 7/2018 | Files ..................... G09G 5/006 |
| 2018/0210514 | A1 * | 7/2018 | Wang .................... G06F 1/1681 |
| 2018/0279028 | A1 | 9/2018 | Mittleman et al. |
| 2018/0284855 | A1 * | 10/2018 | North .................... G06F 1/1681 |
| 2019/0027808 | A1 | 1/2019 | Mow et al. |
| 2019/0141434 | A1 | 5/2019 | Fukuma |
| 2019/0324574 | A1 | 10/2019 | Schooley et al. |
| 2019/0342442 | A1 | 11/2019 | Coverstone |
| 2020/0249726 | A1 * | 8/2020 | Brocklesby ........... G06F 1/1683 |
| 2021/0218135 | A1 | 7/2021 | Ramasamy et al. |

FOREIGN PATENT DOCUMENTS

| | | |
|---|---|---|
| KR | 20070100611 A | 10/2007 |
| KR | 101523602 B1 | 5/2015 |
| TW | 200811786 A | 3/2008 |

* cited by examiner

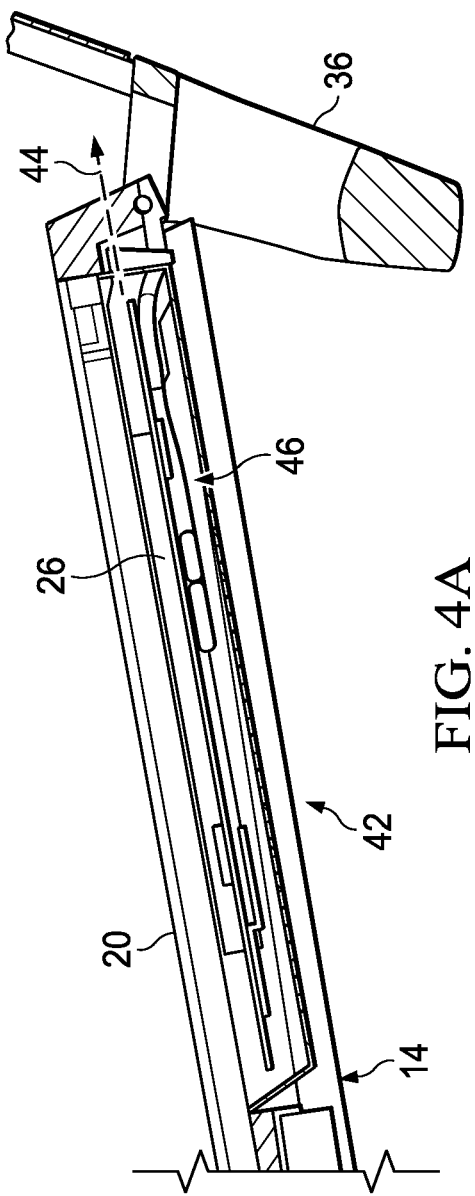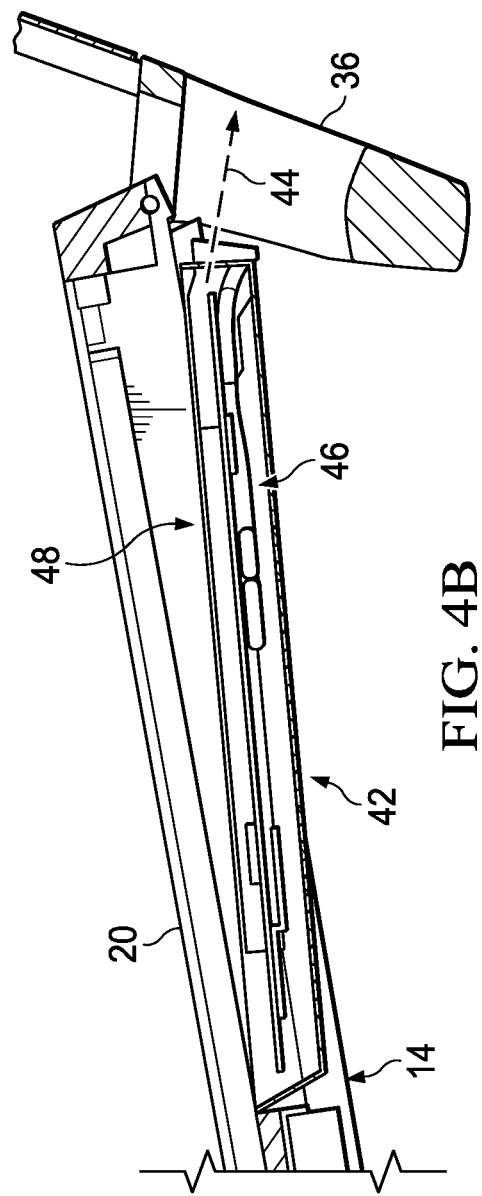

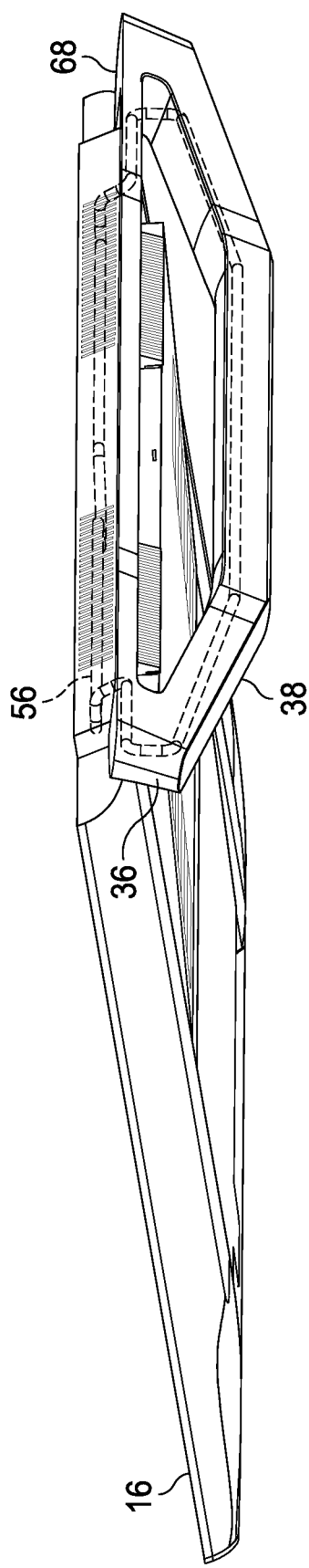
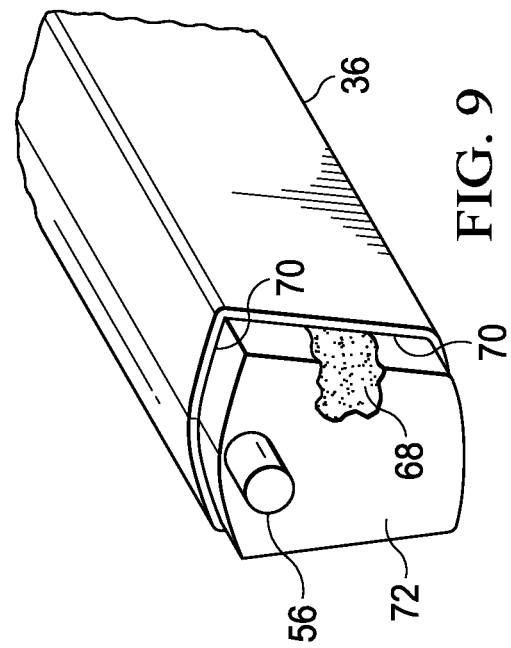
FIG. 8
FIG. 9

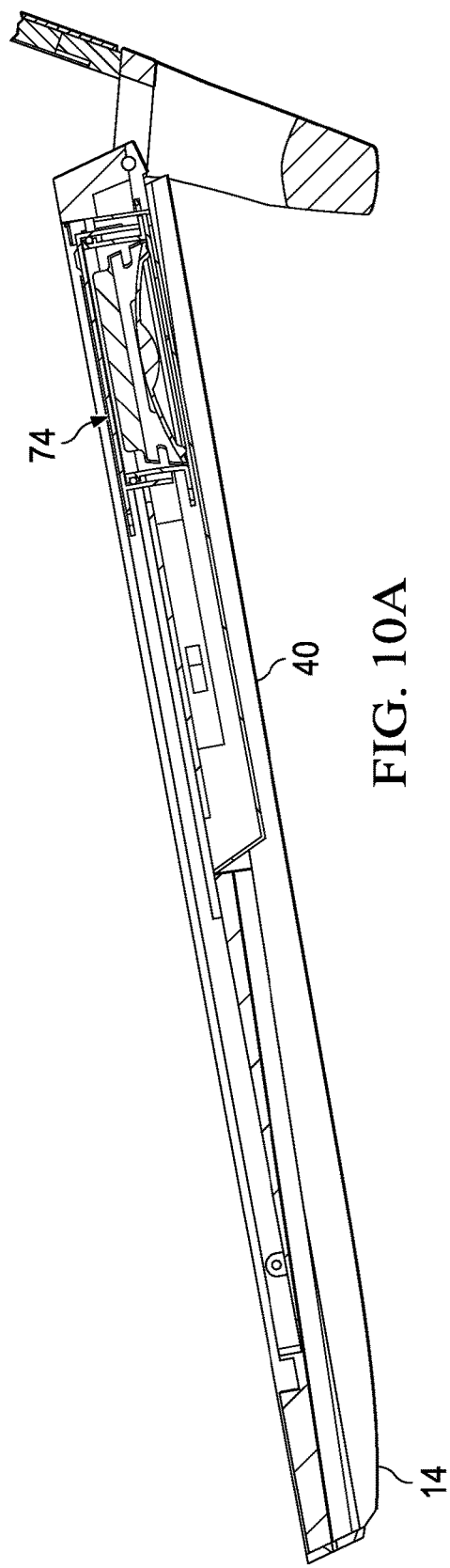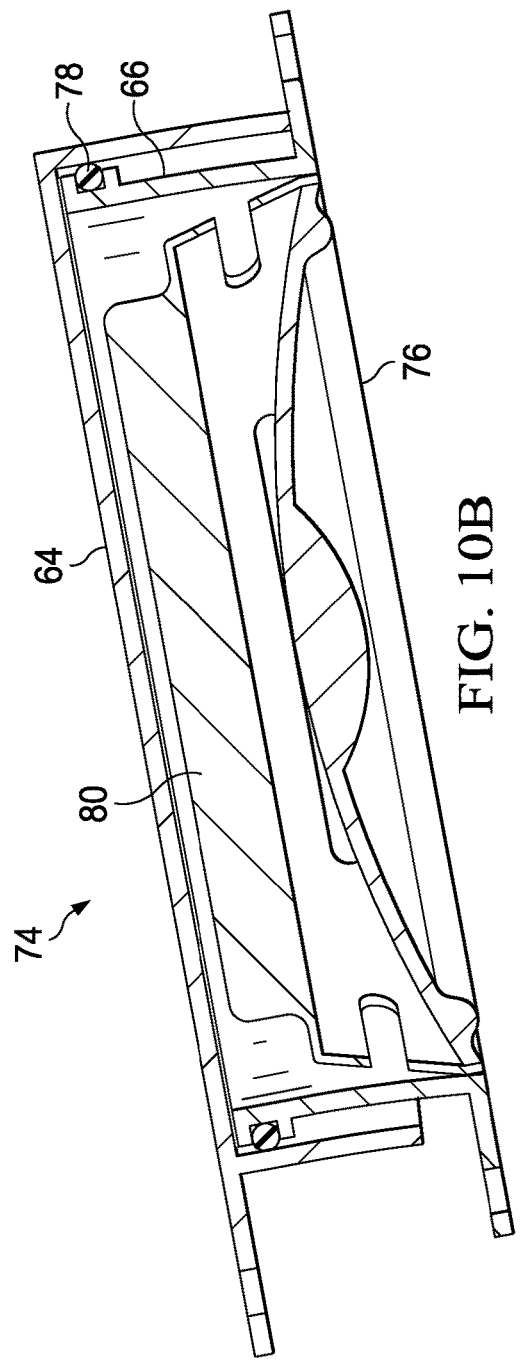
FIG. 10A
FIG. 10B

18% INCREASE TO OPERATIONAL FLOW IN OPEN CONFIGURATION

INFORMATION HANDLING SYSTEM DYNAMIC THERMAL BEHAVIOR

BACKGROUND OF THE INVENTION

Field of the Invention

The present invention relates in general to the field of portable information handling systems, and more particularly to an information handling system dynamic thermal behavior.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Convertible portable information handling system configurations typically include multiple separate housing portions that couple to each other so that the system converts between closed and open positions. For example, a main housing portion integrates processing components and a keyboard and rotationally couples with hinges to a lid housing portion that integrates a display. In a clamshell position, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Generally, portable information handling systems tend to have less powerful processing capability than desktop and other stationary information handling systems. One factor that drives processing capability is power consumption. Processing components, such as central processing units, designed to reduce power consumption tend to have reduced processing capability relative to the components used in desktop systems. Another related factor is thermal management. As power dissipates through processing components, thermal energy is released within the system housing. The smaller size of portable housings tends to make rejection of excess thermal energy more difficult than in larger housings. For instance, cooling fans typically run inside of housings to actively remove excess thermal energy with a cooling airflow, however, smaller housing volumes tend to have greater impedance to airflow that slows airflow and reduces efficiency of thermal rejection. As a result, end users tend to select portable information handling systems with a tradeoff between processing capability and system size.

In some instances, end users desire a maximum processing performance from portable information handling systems. For example, gamers tend to prefer powerful portable systems so that they can play games on the go. Generally, playing games or other applications that perform intense computations on a portable system means somewhat reduced performance relative to a desktop system. End users often enhance the experience when possible by using peripheral devices instead of just integrated device, like the integrated keyboard and display. Portable information handling systems will typically interface through a cable with peripheral displays to provide a larger screen area, peripheral audio speakers to enhanced sound and peripheral keyboards and mice to provide enhanced input devices. Although peripheral devices tend to enhance end user interactions with a portable system, thermal restraints still tend to restrict full use of the system's processing capabilities. Once thermal constraints are reached, processing components are typically throttled to operate at lower clock speeds that generate less excess thermal energy with lower processing performance.

To help manage thermal conditions within a portable housing, processing components often interface with heat sinks that absorb excess thermal energy. An advantage of a heat sink is that bursts of processing may be applied that generate excessive thermal energy, which is stored in the heat sinks to be rejected from the housing when processing operations slow and generate less thermal energy. However, if the heat sinks become too hot, processing clock speeds are typically slowed so that less thermal energy is generated and thermal thresholds of the processing components are not violated. Where high thermal states exist and are managed by heat sinks, elevated temperatures can remain for an extended time period so that the end user experiences reduced performance until temperatures are reduced with active thermal rejection, such as by high fan speeds that provide increased cooling airflow. In addition, elevated thermal states can result in increased temperatures at the external surface of a portable information handling system housing that an end user can find uncomfortable.

Portable information handling system management is further complicated by the many different configurations that a portable system may use. For instance, in a clamshell mode an end user often grasps the housing so that elevated external housing temperatures can impact the end user experience. In some configurations, graphics processing within the portable housing can have large variances based upon the application running on the system and the number and types of external displays interfaced with the system. For example, an end user might run a portable information handling system in a closed configuration that uses only peripheral displays, in an open position that uses both the integrated and peripheral displays, or with only the integrated display. The portable information handling system has to balance thermal energy generated by both the central processing unit and the graphics processing unit across each use case so that the end user experiences a minimal impact on performance.

SUMMARY OF THE INVENTION

Therefore, a need has arisen for a system and method which dynamically manages thermal energy at a portable information handling system.

A further need exists for a system and method which dynamically adjusts audio output from an audio speaker with a variable volume sound chamber.

In accordance with the present invention, a system and method are provided which substantially reduce the disadvantages and problems associated with previous methods and systems that dynamically manage thermal energy and audio output at a portable information handling system. Articulation of one or more of a cooling fan, cooling fin sets, circuit boards and an audio speaker sound chamber provide dynamic control of thermal energy and audio output. Housing outer surface temperatures are managed to a comfort parameter when in a portable mode and a performance mode when in a desktop mode that allows a higher thermal state for enhanced component operating speeds. A thermal well disposed in a carrying handle stores excess thermal energy through a phase change intermediary material to support enhanced component operations, such as extend processor turbo operations. Logic executing on a processor of the system, such as an embedded controller, manages housing temperatures during performance mode for a transition to portable use when indicated by system context.

More specifically, a portable information handling system processes information with processing components disposed in a portable housing. The portable housing has a lid housing portion and a main housing portion rotationally coupled by a motorized hinge that rotates the lid and main housing portions between open and closed positions. Thermal parameters at the portable information handling system are managed with articulation of cooling fans, circuit boards and heat sink cooling fins in response to rotation of the main and lid housing portions by the motorized hinge. In one example embodiment, a cooling fan bay included in the main housing portion articulates downward and out of the lower housing portion through a linkage with the motorized hinge. Cooling fans coupled to the cooling fan bay have upper and lower inlets that accept airflow that passes out an exhaust at a rear side of the main housing portion. When the cooling fan bay extends out the bottom of the main housing portion, additional space is provided at the cooling fan upper inlet that reduces the impedance of airflow into the cooling fan and results in a greater volume of cooling airflow for more efficient thermal rejection. In addition to the cooling fan, a lower circuit board couples to the cooling fan bay and an upper circuit board couples to the main housing portion so that the lower circuit board articulates downward and away from the upper circuit board and with articulation of the cooling fan bay. Each of the upper and lower circuit boards has processing components coupled to it and a heat sink that extends from the circuit board towards the cooling fan exhaust to accept thermal energy from the processing components to the cooling airflow. For example, a graphics processing unit (GPU) couples to an upper circuit board having a fixed position relative to the main housing portion and a central processing unit (CPU) couples to a lower circuit board that articulates with the cooling fan bay. In alternative embodiments, these components may be reversed or other components may be used.

Efficient thermal rejection from upper and lower circuit board heat sinks is managed though cooling fan articulation and a thermal well that stores thermal energy for rejection at an exterior housing feature, such as a carrying handle. For example, a heat sink coupled to a CPU on a lower circuit board terminates with a set of cooling fins coupled by a gasket to the cooling fan exhaust so that cooling airflow from the exhaust remains focused on the cooling fins through cooling fan articulation. A heat sink coupled to a GPU on an upper circuit board terminates with a set of cooling fins that, when the cooling fan bay is retracted to a raised position, interleave with the CPU cooling fins within the cooling fan exhaust. At extension of the cooling fan bay and lowering of the lower circuit board, the cooling fan and CPU cooling fins drop relative to the GPU cooling fins, resulting in withdrawal of the GPU cooling fins from the cooling fan exhaust for a reduced cooling airflow impedance from the cooling fan exhaust. To aid in additional thermal rejection for the GPU, a heat pipe loop, such as a vapor chamber, extends from the GPU heat sink and through a carrying handle coupled to the main housing portion. In one example embodiment, the carrying handle is filled with a thermal wax that stores thermal energy at a phase transition between solid and liquid phases. Excess thermal energy rejects from the carrying handle to lower the GPU thermal state when the cooling fan bay is lowered and provides a thermal well and thermal rejection for both the CPU and GPU when the cooling fan bay is in the raised position. Although the example embodiment is a carrying handle for a portable system, similar thermal wells may be used in desktop and server systems that have housings with handles or other external appendages.

Logic executing on a processor, such as an embedded controller, adjusts thermal parameters based upon housing rotational orientation, end user touch detection, accelerations and other context. For instance, a dynamic thermal performance mode sets external housing temperatures at greater acceptable levels when context indicates the portable information handling system is being used in a stationary or desktop mode, such as where the housing is closed, the system does not detect an end user touch or accelerations, or other context. Once end user touch interactions are indicated, the logic operates to reduce the housing surface temperatures. In one embodiment, an end user closing of the housing commanded to the motorized hinge results in the housing closing at a rate that provides a variable time to the closed state so that a desired carrying handle temperature is reached at the closed state. In addition, the logic can manage system thermal parameters where a link actuator, such as a clutch provides independent control of cooling fan, circuit board and cooling fin positions. In one embodiment, a speaker housing having slidingly engaged housing portions provides a variable volume speaker chamber by sliding the housing between compressed and expanded positions. For instance, one housing portion couples to the upper circuit board and the other housing portion couples to the lower circuit board to expand and contract the speaker chamber volume with the circuit board articulation. The logic on the embedded controller reports the speaker chamber volume to an equalizer to adjust audio output based upon speaker chamber volume. In one embodiment, speaker chamber volume may be selected based upon the type of application executing on the information handling system, the type our audio generated for presentation, and other factors.

The present invention provides a number of important technical advantages. One example of an important technical advantage is that a portable information handling system manages thermal energy to support enhanced processing component operations in a variety of configurations. For example, more efficient thermal rejection provided by articulation of a cooling fan and reduced cooling airflow impedance allow processing components, such as a CPU and GPU, to operate at higher clock speeds for longer time periods to enhance an end user's experience when executing an application and viewing visual images. In one example embodiment, articulation of a cooling fan bay to reduce cooling airflow impedance improves thermal rejection by approximately 18% with a resulting improvement in system thermal parameters, including maintaining a desired housing exterior temperature. Interfacing an external thermal well with the processing components, such as thermal wax disposed in a carrying handle, offers storage of excess thermal energy to support bursts of processing activity, such as a CPU turbo mode. In one example embodiment, a thermal well can increase CPU turbo duration at 120 W of power for 228 seconds with the cooling fan running at a low power setting. Performance improvements are further enhanced where external housing temperature parameters are increased. For example, a 25 W increase in performance is provided for an 8 degree Celsius delta and 37.5 W for a 12 degree Celsius delta by rejecting thermal energy from a carrying handle. Contextual management of thermal conditions provides an adaptive thermal rejection capability and also supports adaptive management of thermal rejection components and audio speaker chamber volume.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 4A and 4B depict a side cutaway view of examples of cooling airflow with the cooling fan bay in raised and lowered positions;

FIG. 8 depicts a rear perspective cutaway view of the portable information handling system having a heat pipe loop disposed through a carrying handle;

FIG. 9 depicts a cutaway view of the interior of the carrying handle having a cap to capture the thermal wax and a graphene sheet around the outer perimeter of the thermal wax to contain the thermal wax when in a liquid phase state;

FIGS. 10A, 10B, 10C and 10D depict a side cutaway view of an audio speaker that articulates between compressed and expanded states to adjust the volume of an internal audio chamber;

DETAILED DESCRIPTION

A portable information handling system dynamically manages a housing thermal state and audio output with articulation of a housing fan bay included in a housing portion. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
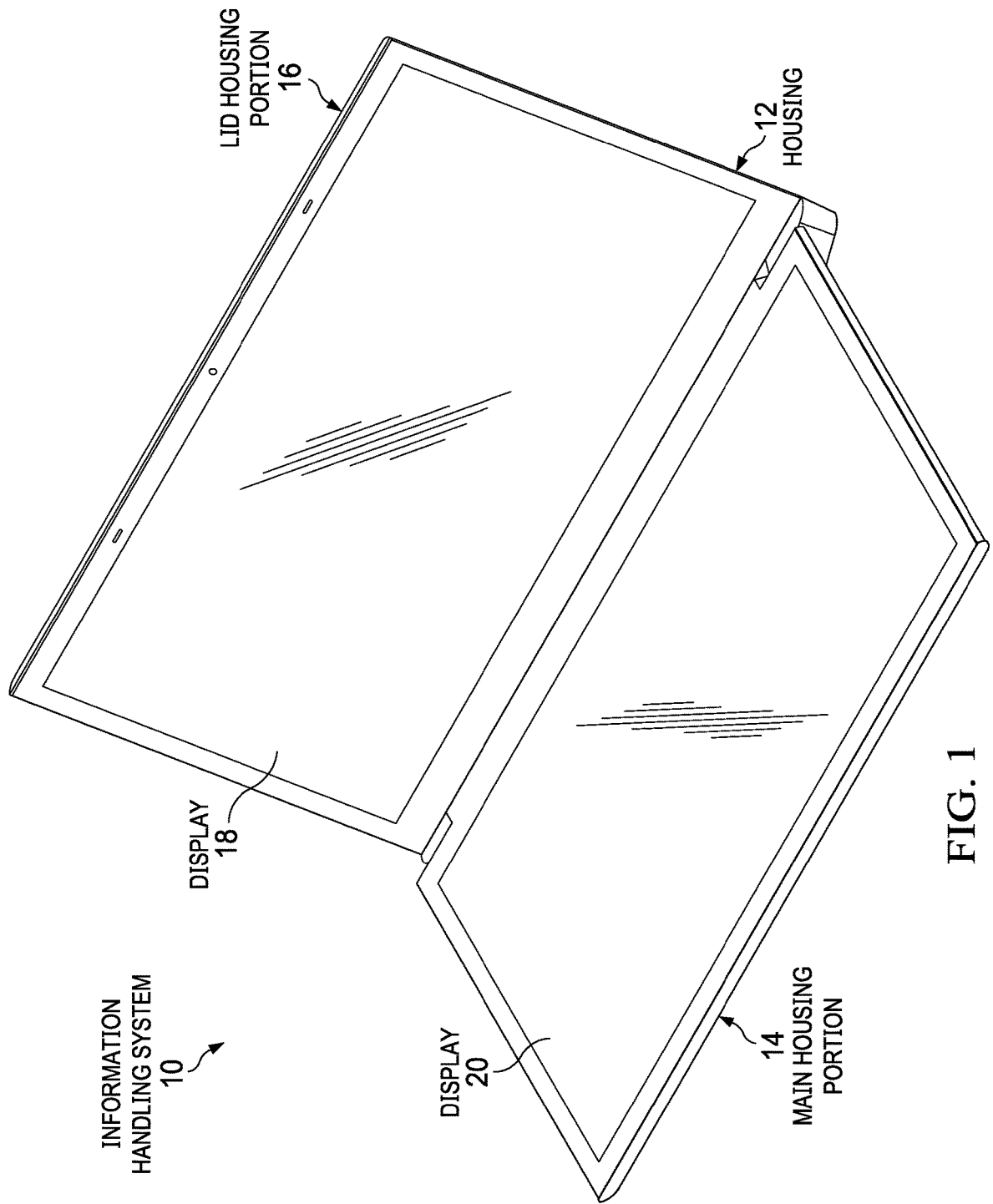
FIG. 1 depicts a side perspective view of a portable information handling system in an open clamshell position and configured to dynamically manage thermal energy.

Referring now to FIG. 1, a side perspective view depicts a portable information handling system 10 in an open clamshell position and configured to dynamically manage thermal energy. In the example embodiment, portable information handling system 10 is built in a portable housing 12 having a main housing portion 14 rotationally coupled to lid housing portion 16. Housing 12 rotates main housing portion 14 relative to lid housing portion 16 between the open clamshell position depicted by FIG. 1 and a closed position having lid housing portion 16 resting in proximity over top of main housing portion 14. A primary display 18 integrated in lid housing portion 16 presents information as visual images, such as with liquid crystal or organic light emitting diode pixels. A secondary display 20 integrated in main housing portion 14 also presents visual images and includes a touch surface to accept typed inputs made at a visual depiction of a keyboard. In alternative embodiments, the upper surface of main housing portion 14 may integrate a physical keyboard to accept keyed inputs. Portable information handling system 10 may process information in open and closed position, and may coordinate inputs and outputs through a variety of peripheral devices, including peripheral keyboards, mice, joysticks, displays, speakers, etc. . . . .

Although dynamic thermal management innovations are described herein with respect to the example portable information handling system 10, the innovations may also be used in other types of information handling systems, such as desktops and servers.

Figure 2A:
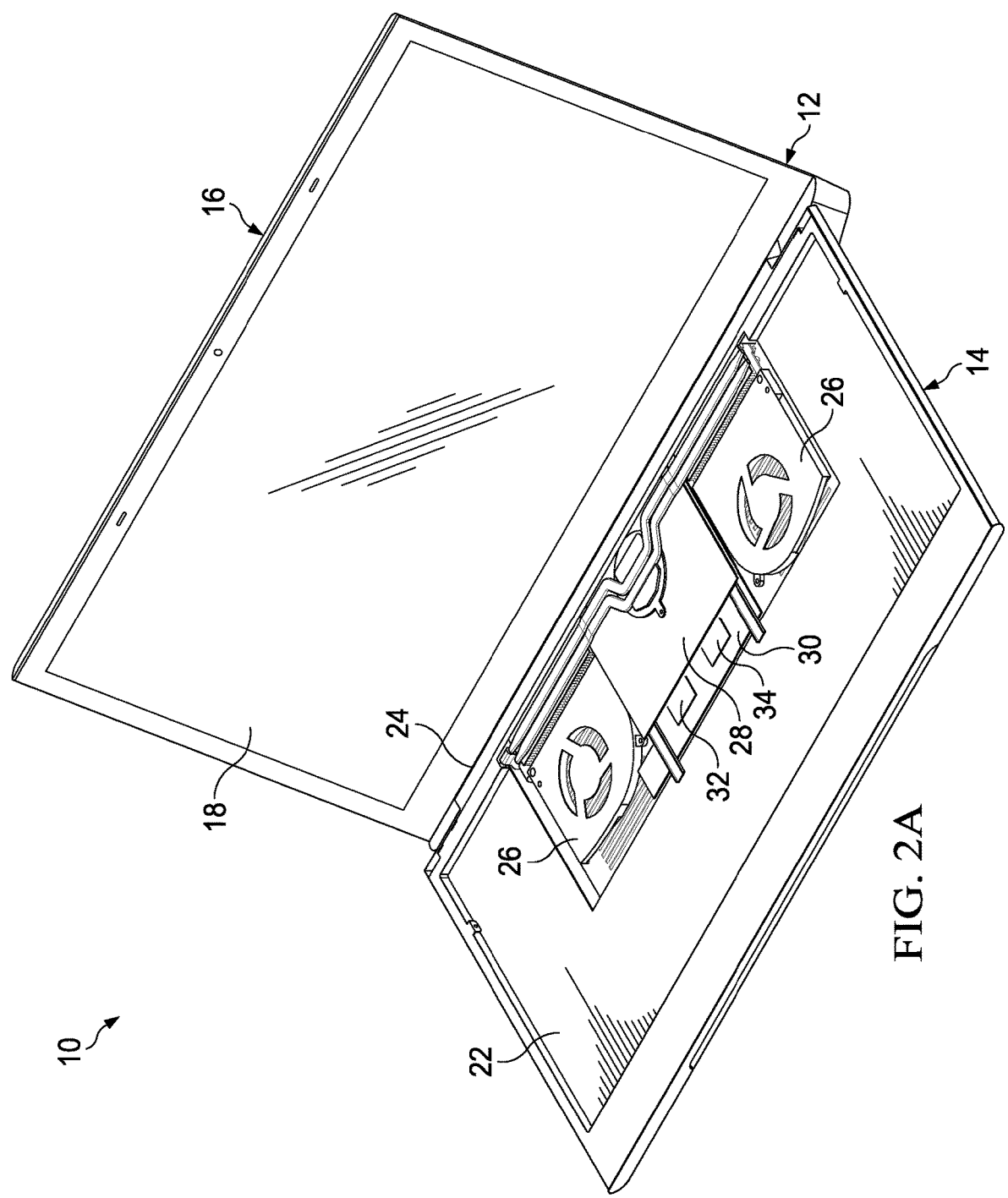
FIGS. 2A and 2B depict the portable information handling system having an articulated circuit board and cooling fan disposed in a raised position relative to the main housing portion.
Figure 2B:
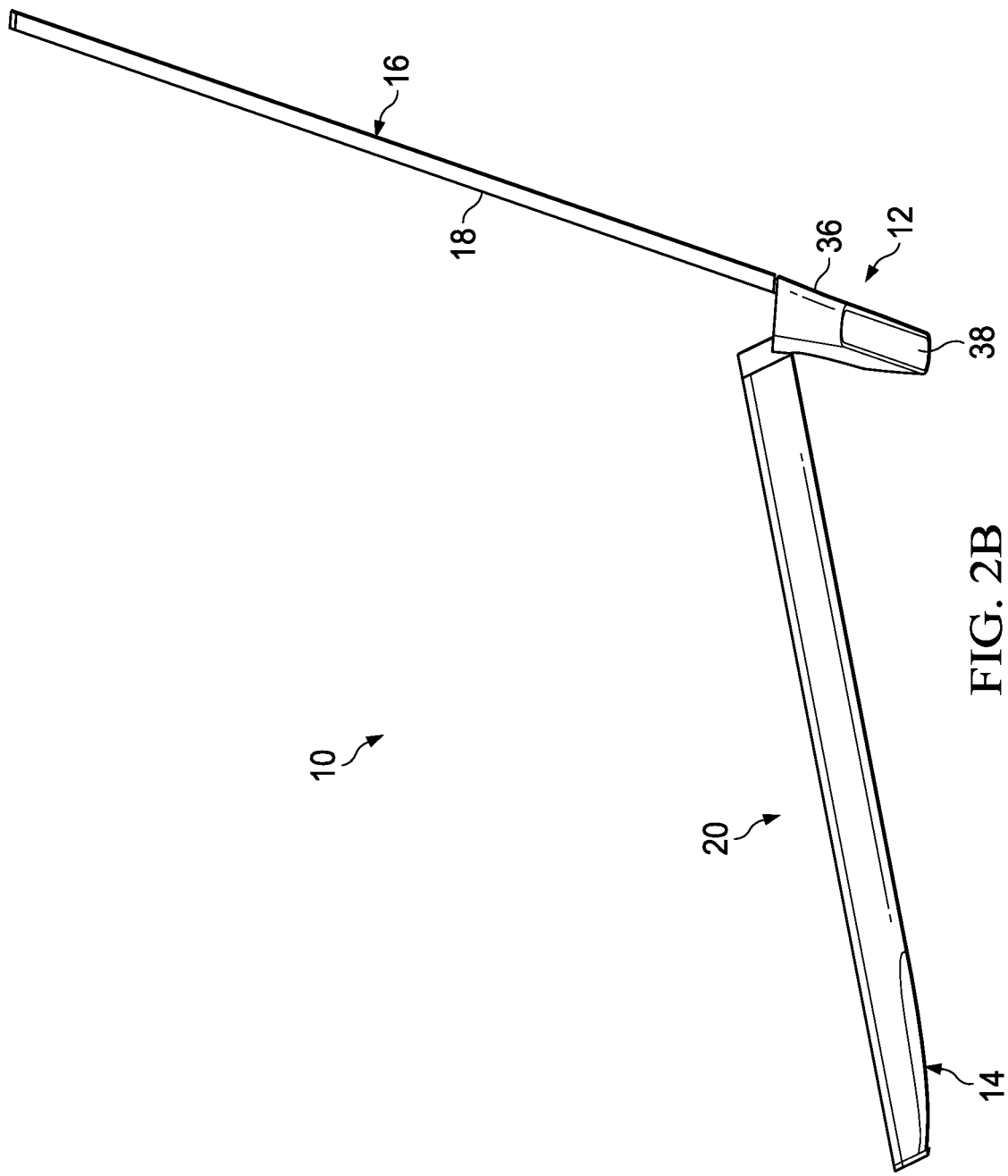

Referring now to FIGS. 2A and 2B, portable information handling system 10 is depicted having an articulated circuit board 30 and articulated cooling fans 26 disposed in a raised position relative to the main housing portion 14. FIG. 2A has display 20 removed from main housing portion 14 to expose a support surface 22 on which display 20 rests. A motorized hinge 24 interfaces with lid housing portion 16 and main housing portion 14 to rotate housing 12 between open and closed positions, such as in response to a button press or other end user selection. Within main housing portion 14, a variety of processing components are disposed that cooperate to process information for presentation at display 18. In the example embodiment, an upper circuit board 28 couples in a fixed position relative to support surface 22 to interface a portion of the processing components and a lower circuit board 30 dynamically couples to main housing portion 14 to move vertically relative to upper circuit board 28 and synchronously to cooling fans 26. As an example, a central processing unit (CPU) 32 and random access memory (RAM) 34 couple to lower circuit board 30 to cooperatively execute instructions that process information. In an alternative embodiment, CPU 32 and RAM 34 may couple to upper circuit board 28, as is described in greater depth below.

FIG. 2B depicts a side view of portable information handling system 10 to illustrate that a carrying handle 36 coupled to lid housing portion 16 rotates downward relative to main housing portion 14 to provide a stand that holds the bottom of main housing portion 14 in a raised position relative to a support surface on which portable information handling system 10 rests. A temperature indicator 38 integrates in carrying handle 36 and illuminates to provide an indication of the temperature of the outer surface of housing 12, such as by illuminating green for a low temperature and red for a high temperature. An advantage of carrying handle 36 is that the bottom surface of main housing portion 14 is raised to provide reduced impedance for cooling airflow into an intake vent located at the bottom of the system.

Figure 3A:
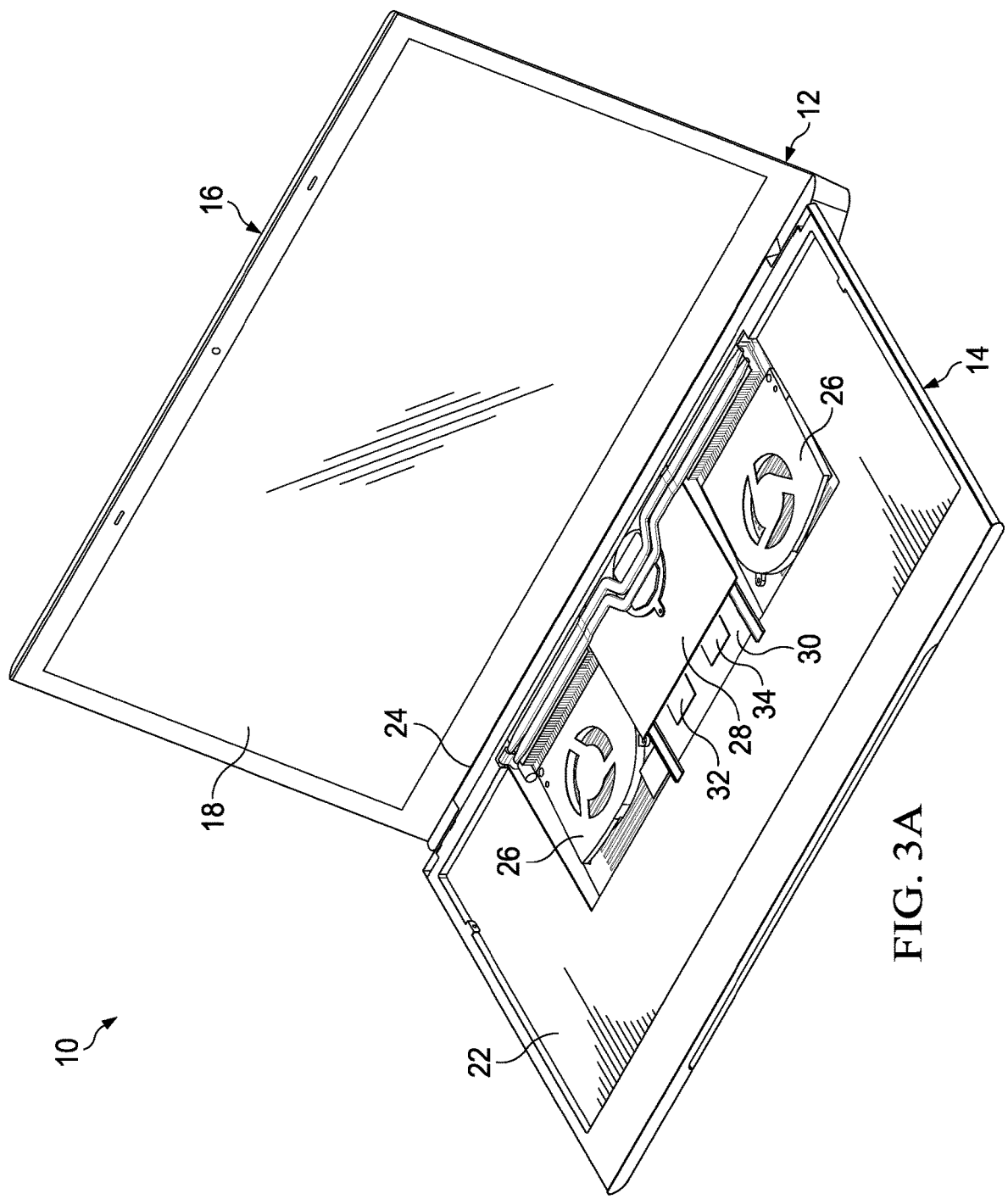
FIGS. 3A and 3B depict the portable information handling system having an articulated circuit board and articulated cooling fans disposed in a lowered position relative to the main housing portion.
Figure 3B:
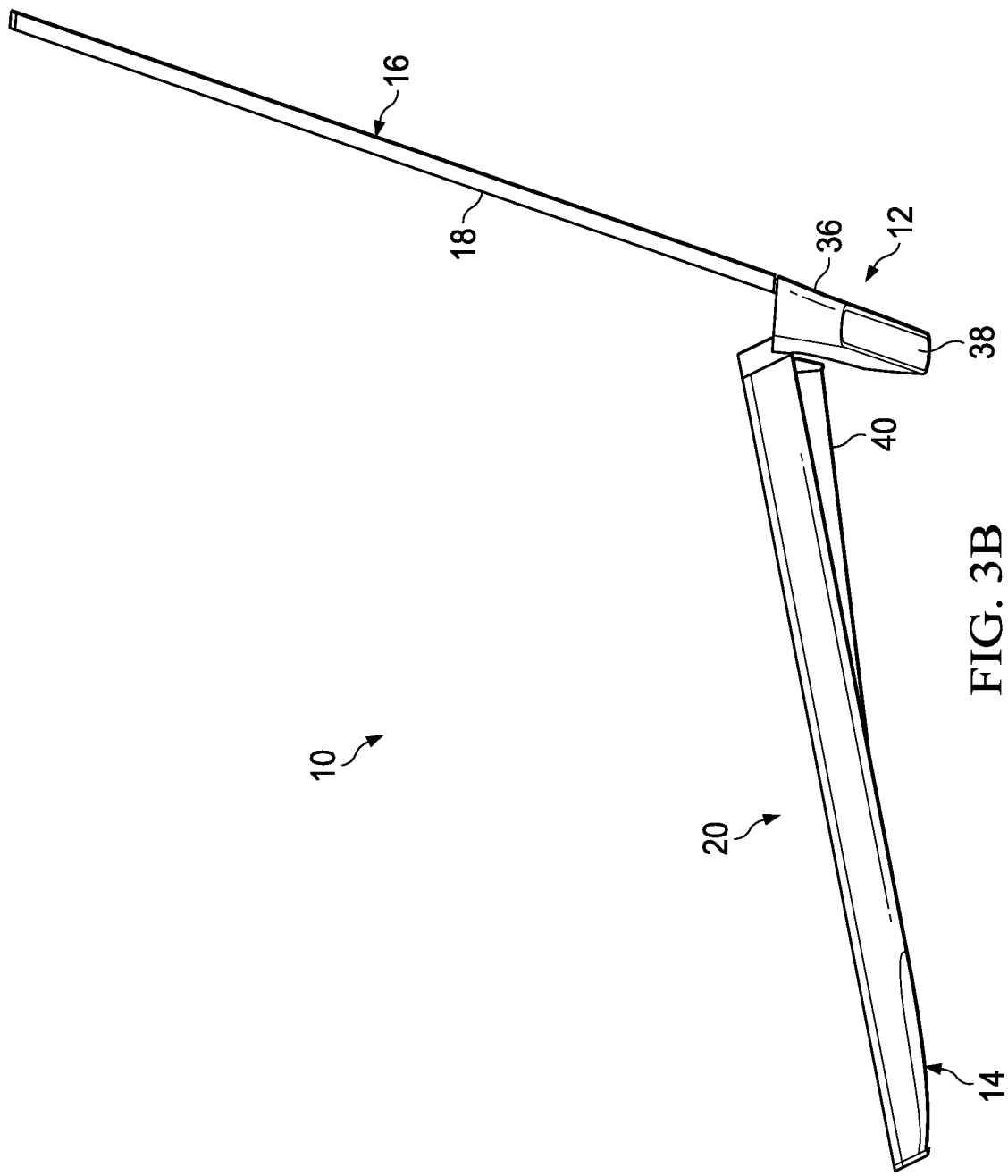

Referring now to FIGS. 3A and 3B, portable information handling system 10 is depicted having an articulated circuit board 30 and articulated cooling fans 26 disposed in a lowered position relative to the main housing portion 14. FIG. 3A illustrates that upper circuit board 28 remains in a constant position relative to main housing portion 14 and support surface 22 while lower circuit board 30 and cooling fans 26 drop to a lower relative position. FIG. 3B shows in a side view that a cooling fan bay 40 included in main housing portion lowers relative to the bottom surface of main housing portion 14 to articulated downward lower circuit board 30 and cooling fans 26 at couple to cooling fan bay 40. The lower position provided by cooling fan bay 40 reduces airflow impedance within housing 12 in several ways. For instance, increased space between the upper circuit board 28 and lower circuit board 30 provides room for air to flow over the processing components and to intake from areas of housing 12 other than the lower surface, such vents formed in a side surface of main housing portion 14. In addition, cooling fans 26 have an upper intake that has increased spacing to accept airflow with reduced impedance. Further, as is discussed below, cooling fans 26 adjust their exhaust at a rear side of main housing portion 14 to direct at carrying handle 36 to help cool a thermal well formed within carrying handle 36. In various embodiments, cooling fan bay 40 may articulate downward under different circumstances. For instance, motorized hinge 24 may automatically lower cooling fan bay 40 when housing 12 rotates to an open position and raise cooling fan bay 40 when housing 12 rotates to a closed position. Alternatively, motorized hinge 24 may include a clutch or other actuator linkage that selectively engages with housing 12 and cooling fan bay 40 separately or simultaneously. In such an embodiment, cooling fan bay 40 may lower and raise independently of housing 12 with housing 12 in both the open and closed positions. This flexibility advantageously provides thermal rejection selectively to the upper and lower circuit boards and adjustments to the vector of cooling airflow exhaust to achieve desired thermal responses as described below.

Referring now to FIGS. 4A and 4B, a side cutaway view depicts examples of cooling airflow with the cooling fan bay 40 in raised and lowered positions. FIG. 4A depicts the housing in an open position so that carrying handle 36 provides a support to raise main housing portion 14 above a support surface. In the raised position, an intake vent 42 formed in the bottom of main housing portion 14 at a lower cooling fan intake 46 is raised above the support surface for improved airflow into the housing with reduced impedance caused by the lower surface proximity to the support surface. Air pulled by cooling fan 26 into main housing portion 14 is then exhausted at an exhaust 44 that rejects thermal energy by passing across a heat sink as described below. With the cooling fan bay in the raised position, cooling fan 26 is raised so that its upper air intake does not have spacing within which to accept substantial airflow in. FIG. 4B illustrates cooling fan bay 40 in a lowered position that lowers cooling fan 26 downward and away from the upper support to provide spacing above an upper cooling fan intake 48 so that cooling airflow can enter cooling fan 26 from both above and below. As a result impedance that resists the cooling airflow is reduced so that the volume of air flow out of exhaust 44 is increased to provide improved thermal rejection. In addition, the vector of airflow out exhaust 44 is adjusted to a more downward direction, such as at carrying handle 36. In one example embodiment, the vector of exhaust 44 may be independently controlled, such as to direct the exhaust airflow to optimize cooling of a component or outer surface area. In one example embodiment, cooling fan 26 may reverse its airflow to draw cooling airflow into main housing portion 14, such as to quicken thermal rejection for carrying handle 36.

Figure 5A:
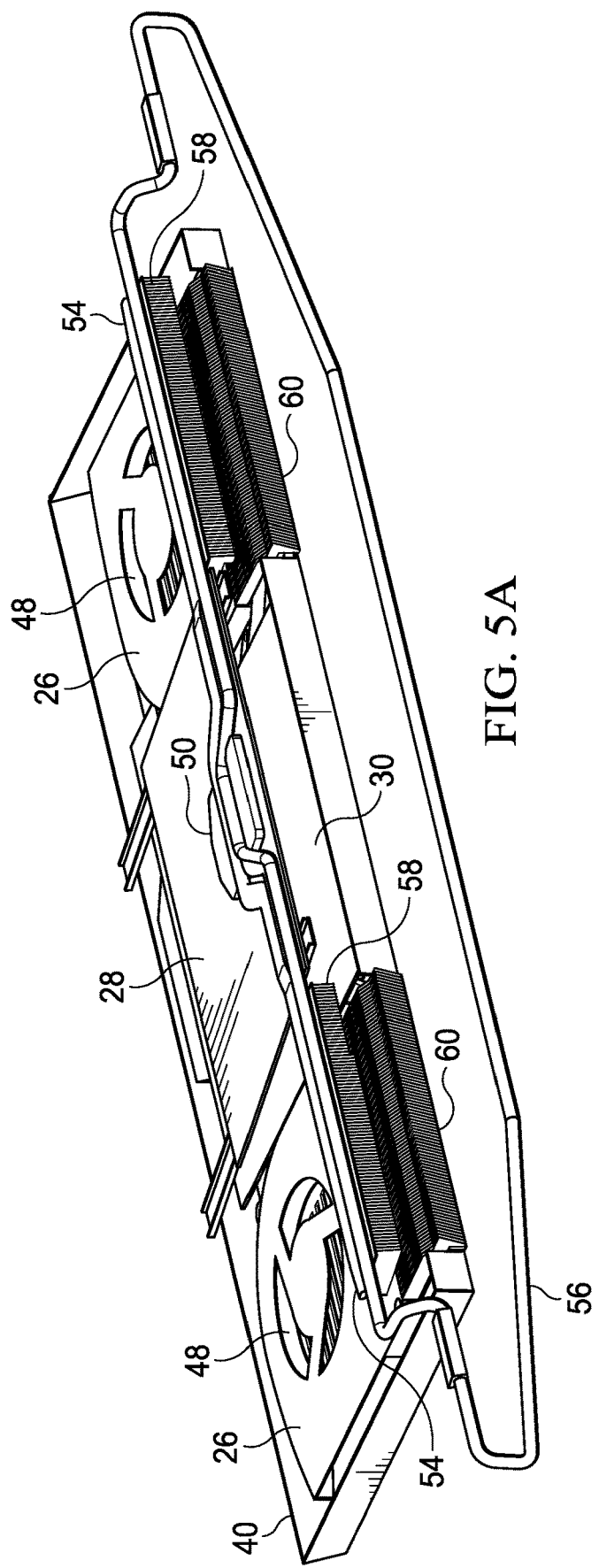
FIGS. 5A and 5B depict rear perspective views of the cooling fan bay configured to reject excess thermal energy to an external heat exchanger.
Figure 5B:
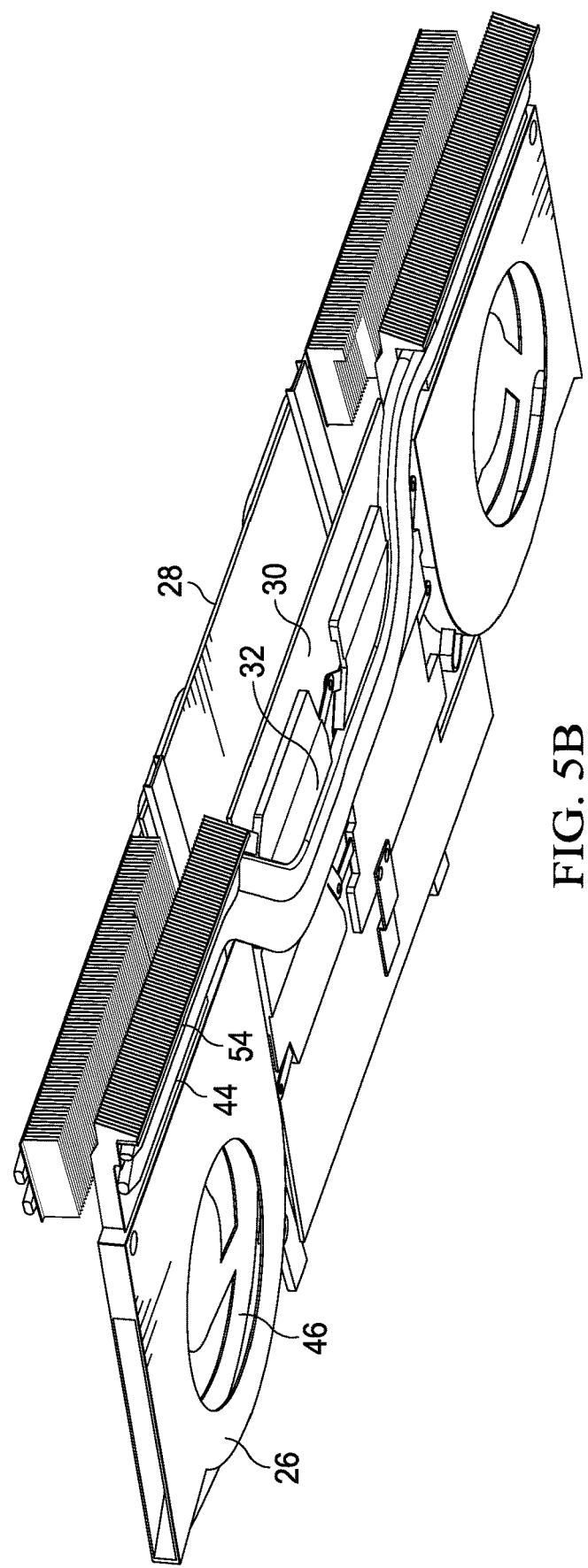

Referring now to FIGS. 5A and 5B, rear perspective views depict the cooling fan bay 40 configured to reject excess thermal energy to an external heat exchanger. In the example embodiment, upper circuit board 28 is depicted in the relative fixed position of the main housing portion where cooling fan bay 40 articulates downward to the lower position. Upper circuit board 28 has a graphical processing unit (GPU) coupled to an upper surface and interfaced with the CPU coupled to lower circuit board 30 below, such as through a cable. GPU 50 receives information from the CPU 32 and further processes the information to generate pixel values that define visual images on the integrated displays and any peripheral displays interfaced through a cable or wireless communication medium. In visually intensive applications and with multiple displays presenting visual images, GPU 50 can generate a good amount of excess thermal energy. Articulation of cooling fan bay 40 to a lower position can help to dissipate excess thermal energy for both the CPU 32 and GPU 50 by delineating how the thermal energy of each is rejected from the housing. FIG. 5B depicts a bottom rear view with lower circuit board 30 articulated downward and having a heat sink assembly 54 that transfers thermal energy from CPU 32 to lower cooling fins 60 that are disposed in the cooling fan exhaust 44.

In the example embodiment, GPU 50 rejects excess thermal energy through two physical heat transfer constructs. The first is a heat sink assembly 54 that couples to GPU 50 at opposing ends that each terminate with a plurality of upper cooling fins 58. The second is a heat pipe loop 56 that couples to GPU 50 and to heat sink 54 at the upper cooling fins 58 to then proceed in a loop to the heat sink 54 on the opposing side. Heat pipe loop 56 is, for example, a vapor chamber that vaporizes a fluid at GPU 50 to transfer thermal energy in the vapor state for release within the loop by transition back to a liquid state. For instance, a check valve and wick within heat pipe loop 56 returns fluid in a liquid state to GPU 50 where it is again vaporized. As is described below in greater detail, the carrying handle provides a thermal well that accepts the thermal energy rejected from heat pipe loop 56 for release to the ambient environment. Although GPU 50 has a direct thermal transfer through heat pipe loops 56, articulation to the lower position separates upper cooling fins 58 from lower cooling fins 60 that are directly exposed to the exhaust of cooling fans 26 so that thermal energy of the CPU 32 is directly handled by a heat exchange system of the lower circuit board 30 without direct intermingling of thermal energy of GPU 50. In lower position of cooling fan bay 40, the upper air inlet 48 of cooling fan 26 does generate some cooling airflow at GPU 50 as air within the housing is drawn out of the housing, through cooling fans 26 and pushed out of the exhaust past lower cooling fins 60.

As is described in greater depth below, the various physical paths for thermal energy rejection from the GPU and CPU offer an opportunity to dynamically manage thermal rejection at the system. For instance, the relative balance of power dissipation between the CPU and GPU may favor delineation of thermal energy through separate thermal pathways or a combined thermal pathway that dissipates thermal energy of both the CPU and GPU through both the upper and lower cooling fins and the heat pipe loop. In the example embodiment, a combined thermal pathway is accomplished by interlocking upper cooling fins 58 and lower cooling fins 60 with an upward articulation of cooling fan bay 40. In an alternative embodiment, lower circuit board 30 may move separately from cooling fan bay 40 to provide interlocking cooling fins while leaving the upper air intake 48 of cooling fan 26 to have spacing above for enhanced airflow volume. In the example embodiment, interlocking of the cooling fins results in both sets of cooling fins disposed in the cooling fan exhaust, which can result in increased impedance that resists cooling airflow out of the exhaust. In an alternative embodiment, the upper cooling fins 58 may interlock with the lower cooling fins 60 to provide a physical path for thermal energy transfer but have the physical interlocking outside of the cooling fan exhaust so that airflow impedance is not increased by creation of a physical transfer interface for thermal energy.

Figure 6A:
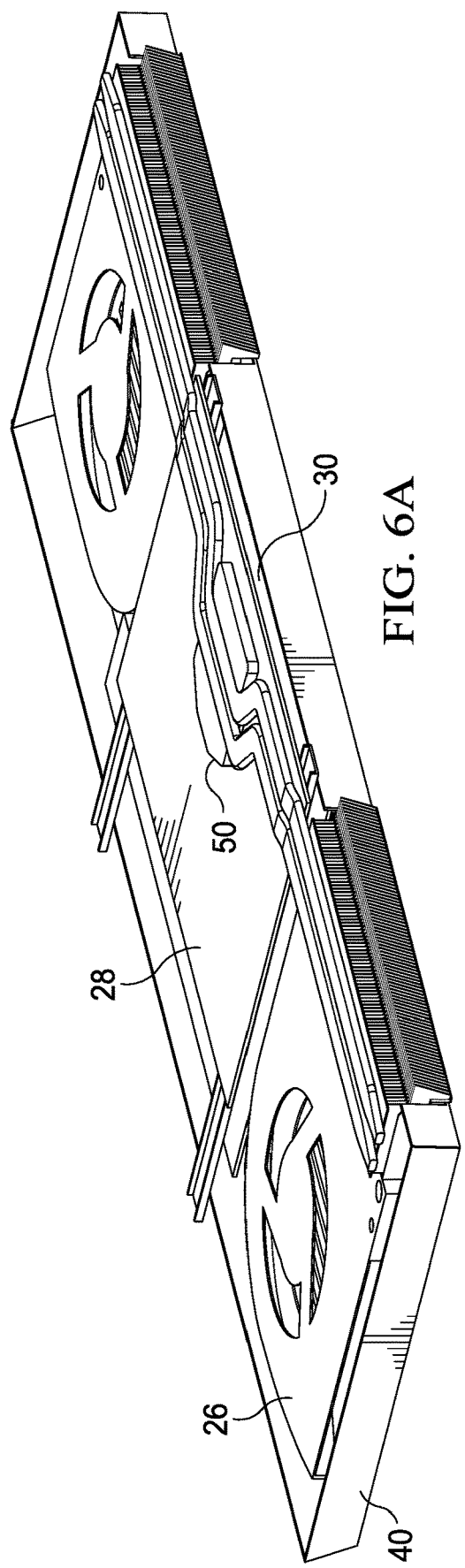
FIGS. 6A, 6B, 6C and 6D depict articulation of upper and lower sets of cooling fins between separated and interlocked positions.
Figure 6B:
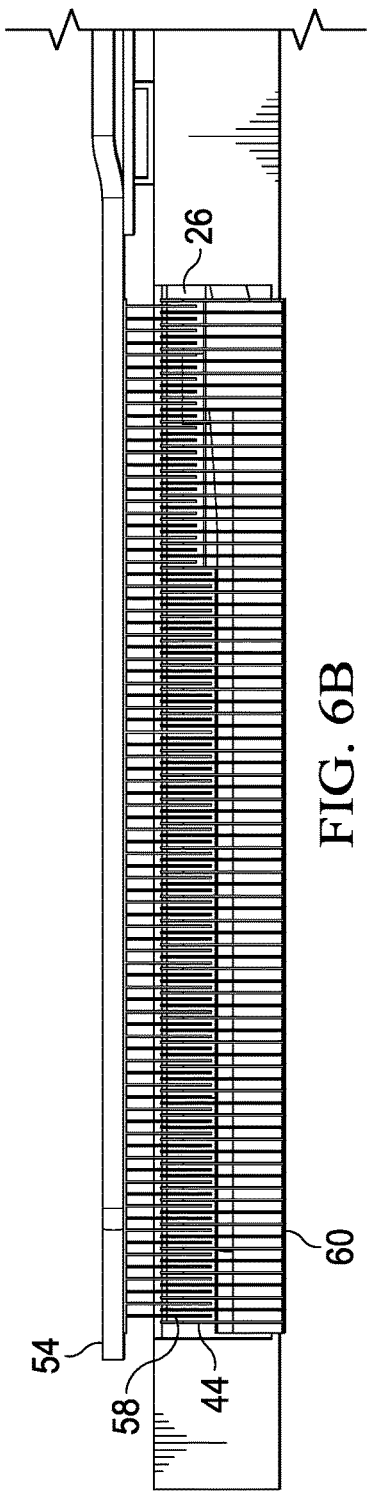
Figure 6C:
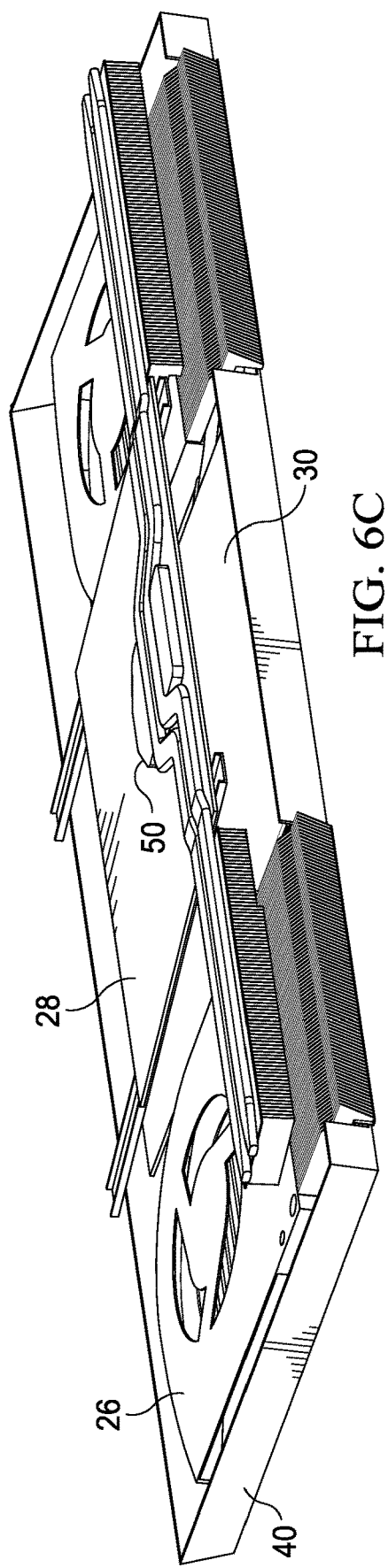
Figure 6D:
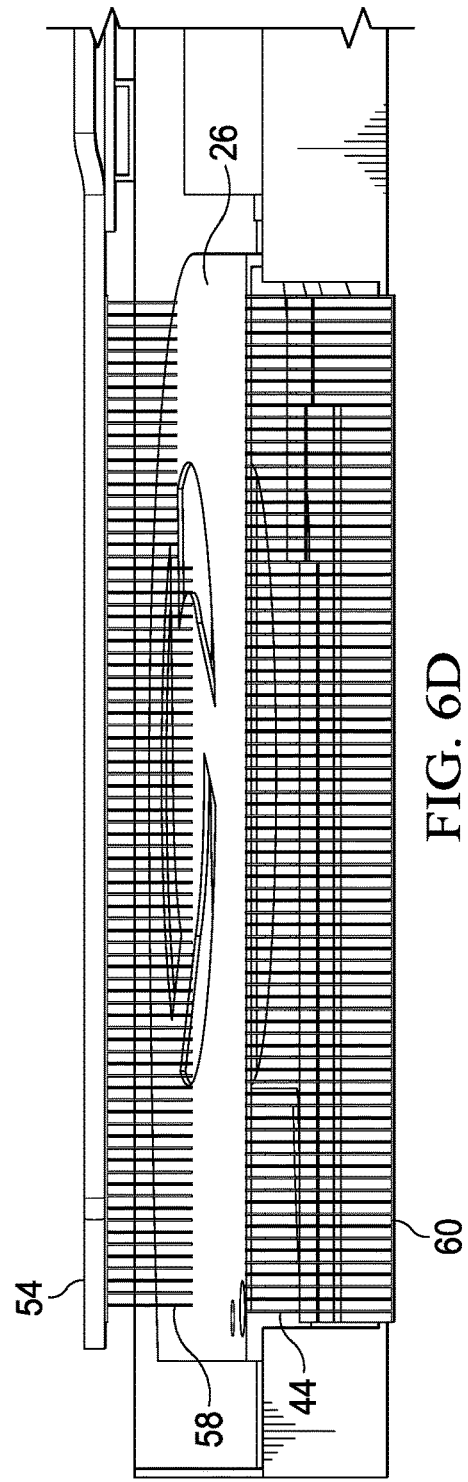

Referring now to FIGS. 6A, 6B, 6C and 6D, articulation of upper and lower sets of cooling fins is depicted between separated and interleaved positions. FIG. 6A depicts cooling fan bay 40 articulated to an upward position that brings lower circuit board 30 up towards upper circuit board 28 and raises cooling fans 26. In this raised position, cooling fan bay 40 retracts into the main housing portion to reduce the system thickness. As depicted by FIG. 6B, raising the lower circuit board 30 brings the lower set of cooling fins 60 upwards towards and interleaved with the upper set of cooling fins 58. In the example embodiment, the interleaved sets of cooling fins 58 and 60 both align within the exhaust 44 so that thermal energy is removed from both, but impedance of the airflow is increased out of the exhaust 44. FIG. 6C depicts cooling fan bay 40 articulated to the lower position that separates upper circuit board 28 from lower circuit board 30 and provides increased spacing above cooling fan 26 for reduced airflow impedance at the upper cooling fan inlet. FIG. 6D depicts separation of the upper and lower sets of cooling fins 58 and 60 that results from articulation to the lower position by lower circuit board 30. In the example embodiment, the separation between lower and upper sets of cooling fins 58 and 60 is complete so that no contact takes place and exhaust 44 only blows through lower set of cooling fins 60. In an alternative embodiment, lower set of cooling fins 60 may extend upward and above cooling fan exhaust 44 to maintain contact with upper set of cooling fins 58 so that a physical path for thermal energy transfer is maintained while only the lower set of cooling fins 60 is disposed in the exhaust 44.

Figure 7:
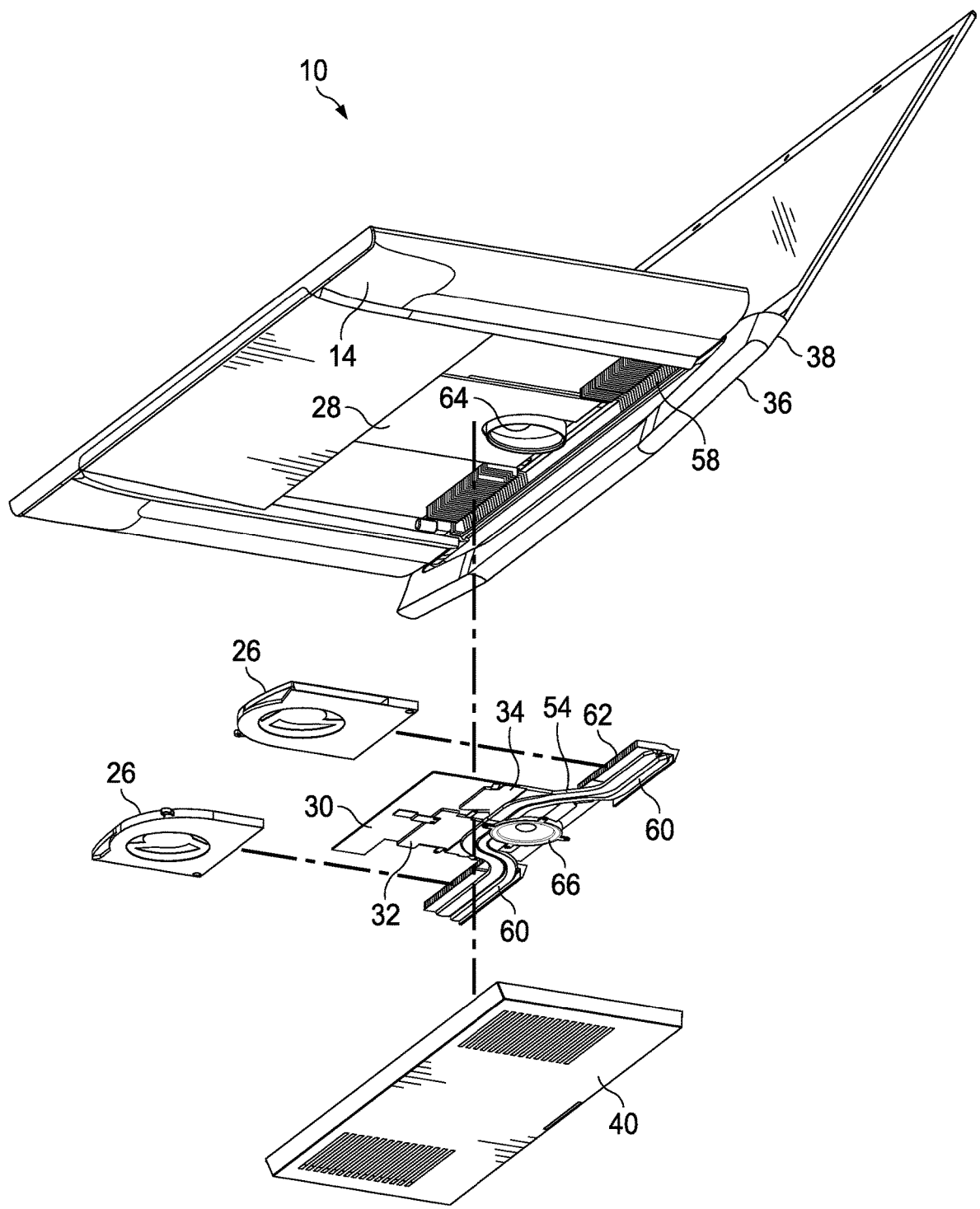
FIG. 7 depicts a bottom perspective exploded view of the cooling fan bay out of the portable information handling system.

Referring now to FIG. 7, a bottom perspective exploded view depicts the cooling fan bay 40 out of the portable information handling system 10. Cooling fans 26 and lower circuit board 30 couple to cooling fan bay 40 to move by articulation of cooling fan bay 40 between upper and lower positions. Cooling fans 26 couple to the lower heat sink 54 with a gasket 62 disposed at the lower set of cooling fins 60. Gasket 62 helps to adjust the relative position of cooling fans 26 to heat sink 54 by allowing sliding of heat sink 54 within the exhaust of cooling fan 26 during articulation. Cooling fan bay 40 couples into a recess of main housing portion 14 at the location of upper circuit board 28. Carrying handle 36 with integrated color-coded temperature indicator 38 extend downward to provide a stand that maintains cooling fan bay 40 above a support surface on which portable information handling system 10 rests. In the example embodiment, an upper speaker housing portion 64 couples to the upper circuit board 28 and a lower speaker housing portion 66 couples to lower circuit board 30 so that articulation of the lower circuit board 28 adjusts a speaker chamber volume as described in greater depth below.

Referring now to FIG. 8, a rear perspective cutaway view of portable information handling system 10 depicts disposition of a heat pipe loop 56 through a carrying handle 36. In the example embodiment, carrying handle 36 includes a hollow central portion that is filled with an organic thermal wax heat sink 68 that acts as a thermal well to store excess thermal energy. For example, thermal wax fills the central portions of carrying handle 56 and maintains a solid state in a reduced thermal temperature region. As heat pipe loop 36 releases thermal energy, wax heat sink 68 heats to a transition state at which the wax transitions from the solid phase to a liquid phase. Through the transition of phase, the temperature of carrying handle 36 remains fairly consistent so that, once the temperature exceeds the phase change temperature, a definitive indication of the thermal state is provided to the information handling system to allow dynamic management processing component power dissipation, such as by throttling components. Similarly, after a command to power down the system, a temperature at the phase transition may provide a good indication at which the housing surface temperature has cooled sufficiently to permit end user handling. For example, the motorized hinge may set a rate of closing so that the housing does not close until the temperature of wax heat sink 68 approaches the phase transition temperature. This allows the carrying handle to cool until a stable temperature is reached at which thermal energy is rejected efficiently so that minimal wait is imposed on the end user until the system is ready for transportation. FIG. 9 depicts a cutaway view of the interior of carrying handle 36 having a cap 72 to capture the thermal wax and a graphene sheet 70 around the outer perimeter of the thermal wax to contain the thermal wax when in a liquid phase state.

Figure 10C:
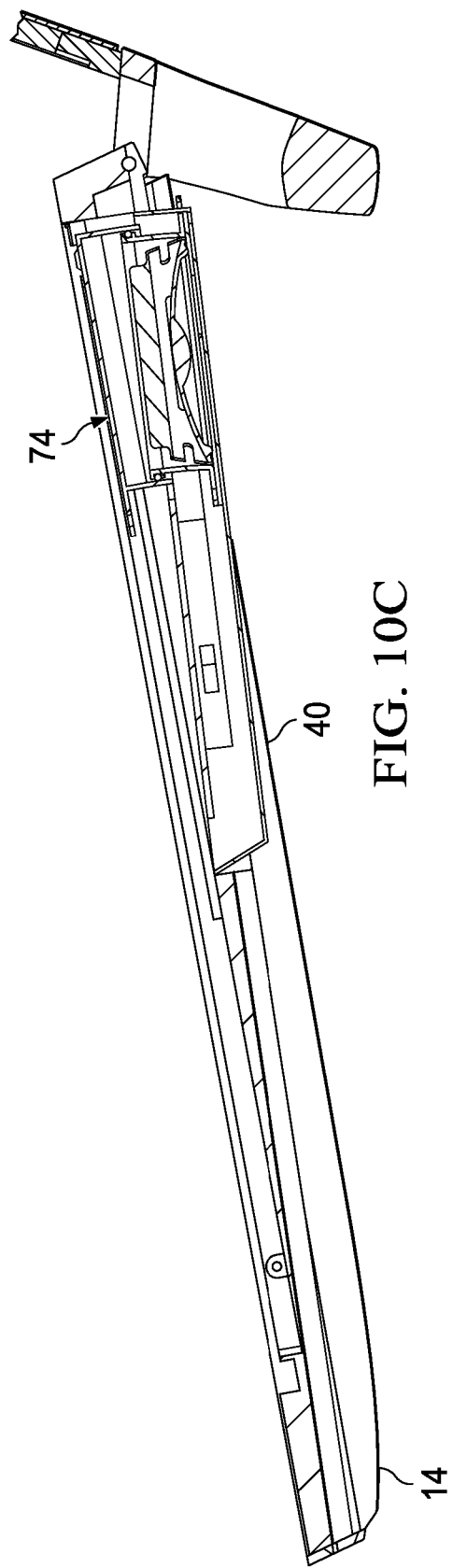
Figure 10D:
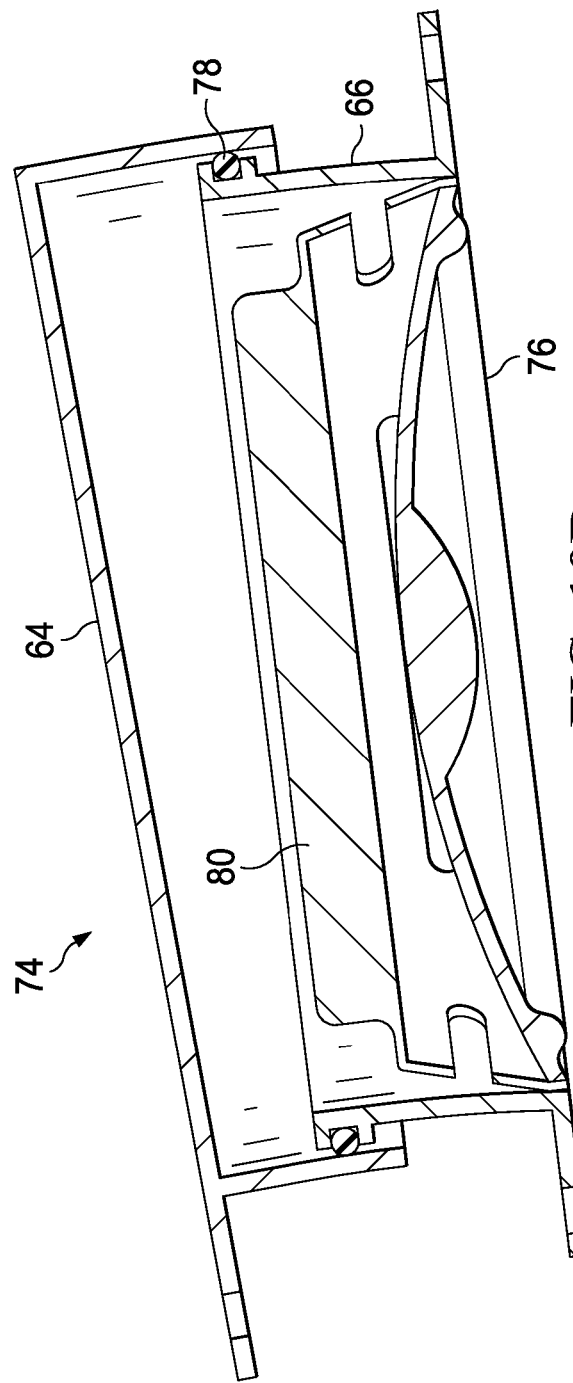

Referring now to FIGS. 10A, 10B, 10C and 10D, a side cutaway view depicts an audio speaker that articulates between compressed and expanded states to adjust the volume of an internal audio chamber. FIG. 10A depicts portable information handling system 10 in an open position with the cooling fan bay 40 in a retracted position so that audio speaker 74 has a speaker chamber 80 of reduced volume. FIG. 10B depicts a close up view of audio speaker 74 having upper housing portion 64 slidingly engaged with lower housing portion 66 and sealed by a gasket 78 to define a compressed speaker chamber 80 of reduced volume. FIG. 10C depicts portable information handling system 10 having cooling fan bay 40 extended to a lowered position that slides lower speaker housing portion 66 downward out of upper speaker housing portion 64 to define an increased volume of speaker chamber 80. FIG. 10D depicts the sliding motion of speaker housing portions 64 and 66 to define the expanded speaker chamber 80 with a seal provided by gasket 78. A transducer 76 disposed at the lower side of lower speaker housing portion 66 provides audible sounds in response to a signal, such as a bass sound range. In the bass range, the efficiency of transducer 76 improves with the volume of the speaker chamber so that speaker sound and quality improve in the expanded configuration shown by FIG. 10D. In the example embodiment, a 50 mm transducer has a fully expanded backvolume of 45 cc for a 30 cc increase over that provided in the compressed state.

Figure 11:
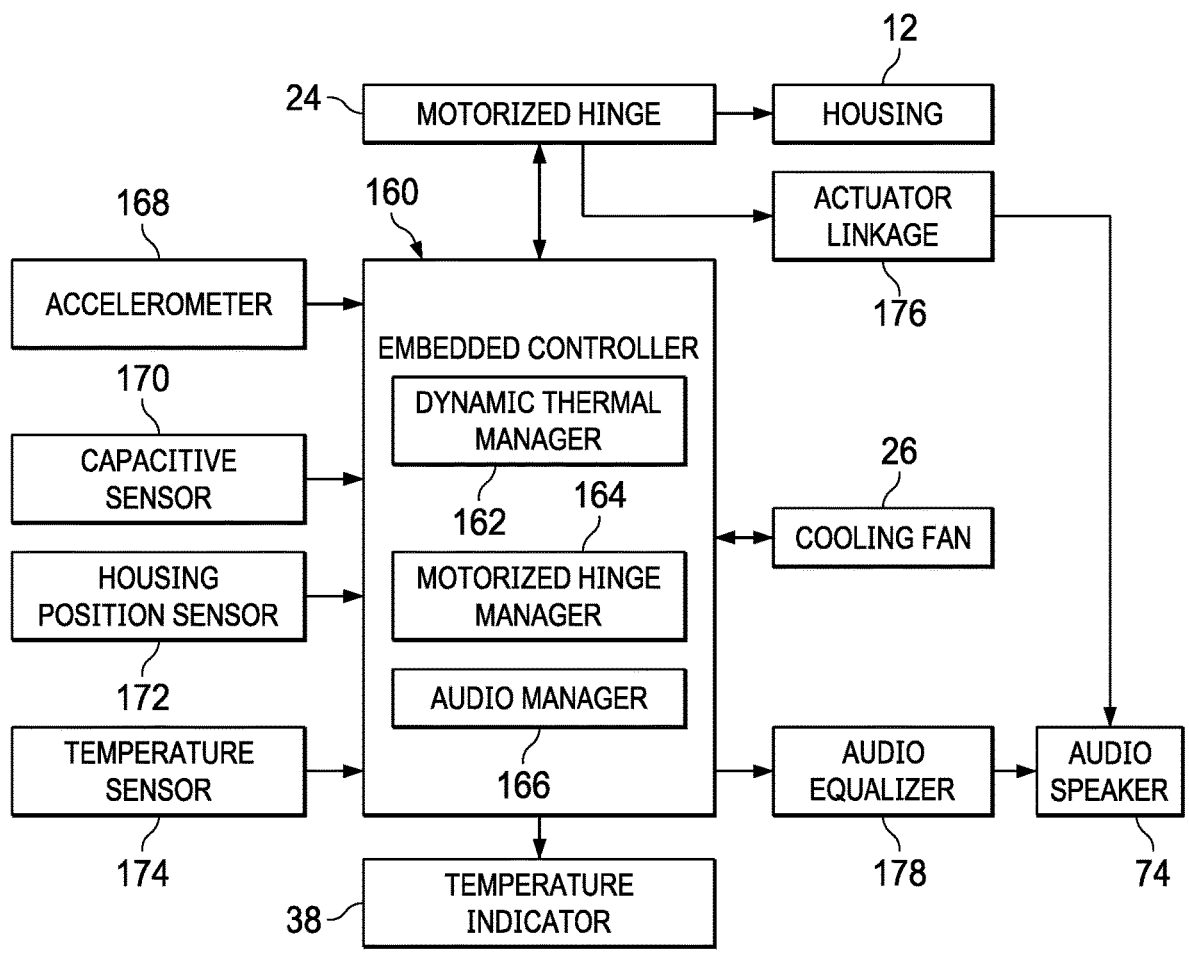
FIG. 11 depicts a functional block diagram of an embedded controller that dynamically adapts thermal and audio functions.

Referring now to FIG. 11, a functional block diagram depicts an embedded controller 160 that dynamically adapts thermal and audio functions. For example, embedded controller 160 is a keyboard controller coupled to the lower circuit board and interfaced with the CPU to manage input and output devices, such as a keyboard and mouse, and to manage components on a physical level, such as for application of power. In the example embodiment, embedded controller 160 integrates flash memory that stores instructions for execution to provide thermal and audio functions based upon a sensed context. For example, a dynamic thermal manager 162 interfaces with accelerometers 168, capacitive sensors 170, housing position sensor 172 and temperature sensor 174 to determine a thermal context upon which thermal parameters are set. A motorized hinge manger 164 interfaces with a motorized hinge 24 to manage housing 12 rotational orientation and operation of an actuator linkage 176 that, in one alternative embodiment, commands positions for cooling fans 26 and audio speaker 74. An audio manager 166 interfaces with audio speaker 74 and an audio chipset to manage audio sound generation based upon speaker chamber volume settings. Although the example embodiment stores the instructions in integrated flash memory, alternative embodiments may distribute firmware functions in other non-transitory memory, such as a flash memory integrated circuit or as an operating system module stored in a solid state drive or hard disk drive. Some examples of logic that manages thermal and audio operations based upon context are detailed below.

Figure 12:
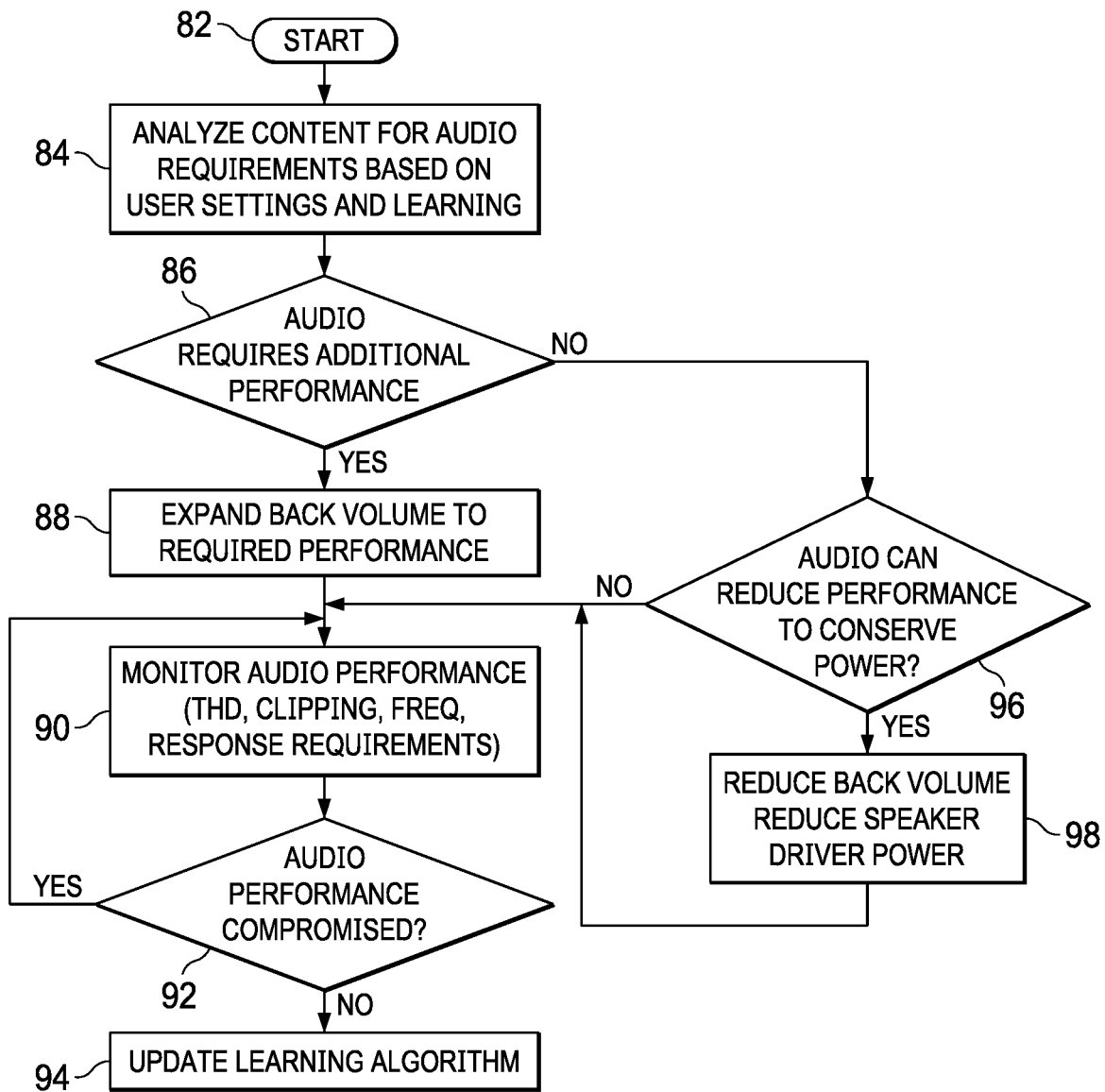
FIG. 12 depicts a flow diagram of a process that manages audio output from a speaker having a variable volume.

Referring now to FIG. 12, a flow diagram depicts a process that manages audio output from a speaker having a variable volume. In the example embodiment, audio speaker volume changes may be achieved by changing a fan bay position or by independently managing slidingly engaged speaker housing portions with actuator linkage 176, such as by a clutch-managed actuation of motorized hinge 24. The process starts at step 82, such as at system startup or initiation of an application that uses bass speaker output, and continues to step 84 to analyze content for audio requirements based upon user settings and learning. For example, a determination of enhanced audio output may relate to a type of application that plays audio, such as music or gaming applications, or a type of audio that relies upon audible output in the frequency range of the audio speaker, such as enhanced bass output. At step 86, a determination is made based upon the context of whether the audio requires additional performance. If enhanced audio is desired, the process continues to step 88 to expand the speaker chamber by commanding with audio manager 166 actuation of motorized hinge manager 164. In addition, once an enlarged speaker chamber is commanded, whether directly or as a byproduct of housing rotation, audio manager 166 provides the speaker chamber setting to an audio equalizer 178 to equalize the enhanced bass sound against other speaker outputs, such as by re-mixing output between plural speakers so that the desired output remains balanced. Audio equalizer 178 also manages speaker volumes so that a sound volume selected by the end user remains consistent through variable speaker chamber volumes.

Once the speaker chamber volume expands at step 88, the process continues to step 90 to monitor audio performance for any degradation, such as with a microphone that captures played audio. If at step 92 audio performance remains acceptable, the process returns to step 90 to continue monitoring audio output. If at step 92 some degradation in sound quality is detected, the process continues to step 94 to update an audio learning algorithm and then returns to step 84 to re-evaluate speaker chamber position. If at step 86 the audio does not require additional performance, the process continues to step 96 to further evaluate whether other advantages may result from use of an expanded versus contracted speaker chamber. At step 96 a determination is made of whether audio can reduce performance to conserve power for the information handling system. In one example embodiment, this evaluation may vary based upon whether external or internal power is used at the information handling system, such as by the presence of an external power source. If enhanced audio remains desirable, the process continues to step 90 to monitor the audio output as described above. If at step 96 a reduced audio is acceptable, the process continues to step 98 to reduce the audio chamber size and speaker drive power, with appropriate adaptations by the equalizer for output of other speakers to achieve a balanced sound.

Figure 13:
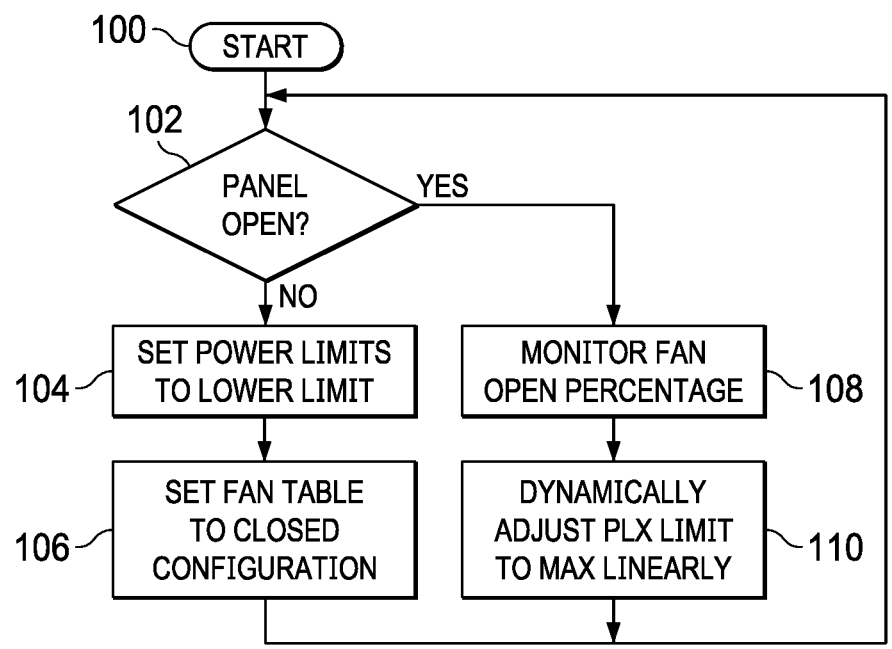
FIG. 13 depicts a flow diagram of a process for managing thermal conditions at a portable information handling system based upon context.

Referring now to FIG. 13, a flow diagram depicts a process for managing thermal conditions at a portable information handling system based upon context. The process starts at step 100, such as at power up of the system, and continues to step 102 to determine if the housing is in an open or closed position. As described in one example embodiment above, the open position results in a lowering of the cooling fan bay at the bottom side of the main housing portion so that the cooling fans have reduced impedance for accepting a cooling airflow at both upper and lower airflow inputs. In addition, the example embodiment where articulation of the circuit boards vertically apart from each other removes a set of cooling fan fins from the cooling fan exhaust, the open housing position also reduces impedance resisting cooling airflow out the exhaust. Reduced cooling fan impedance at the intakes provides a greater volume of airflow to assist thermal rejection from the set of cooling fins that thermally interface with the CPU and reduced exhaust impedance provides more rapid flow past the CPU cooling fins so that the CPU can operate at greater thermal threshold. At step 102 if the housing rotates to an open position, the process continues to step 108 to set fan speed for monitoring with logic and temperatures associated with the reduced impedance. For example, in a fully opened housing with the lowest impedance, the CPU may operate at a full turbo power of 65 W while a closed housing limits CPU power consumption to 45 W. As another example, a low impedance operating context may allow greater time periods of operation a full turbo settings. At step 110, the power and thermal management settings are adjusted based upon the parameters associated with the housing rotational orientation and the process returns to step 102 to continue monitoring housing rotational orientation. If at step 102 the housing is in a closed rotational orientation, the process continues to step 104 to set thermal parameters at the reduced values associated with increased cooling fan intake and exhaust impedances. At step 106, the cooling fan speeds are set for use with the closed housing configuration and the process returns to step 102 to continue monitoring the housing rotational configuration.

Figure 14:
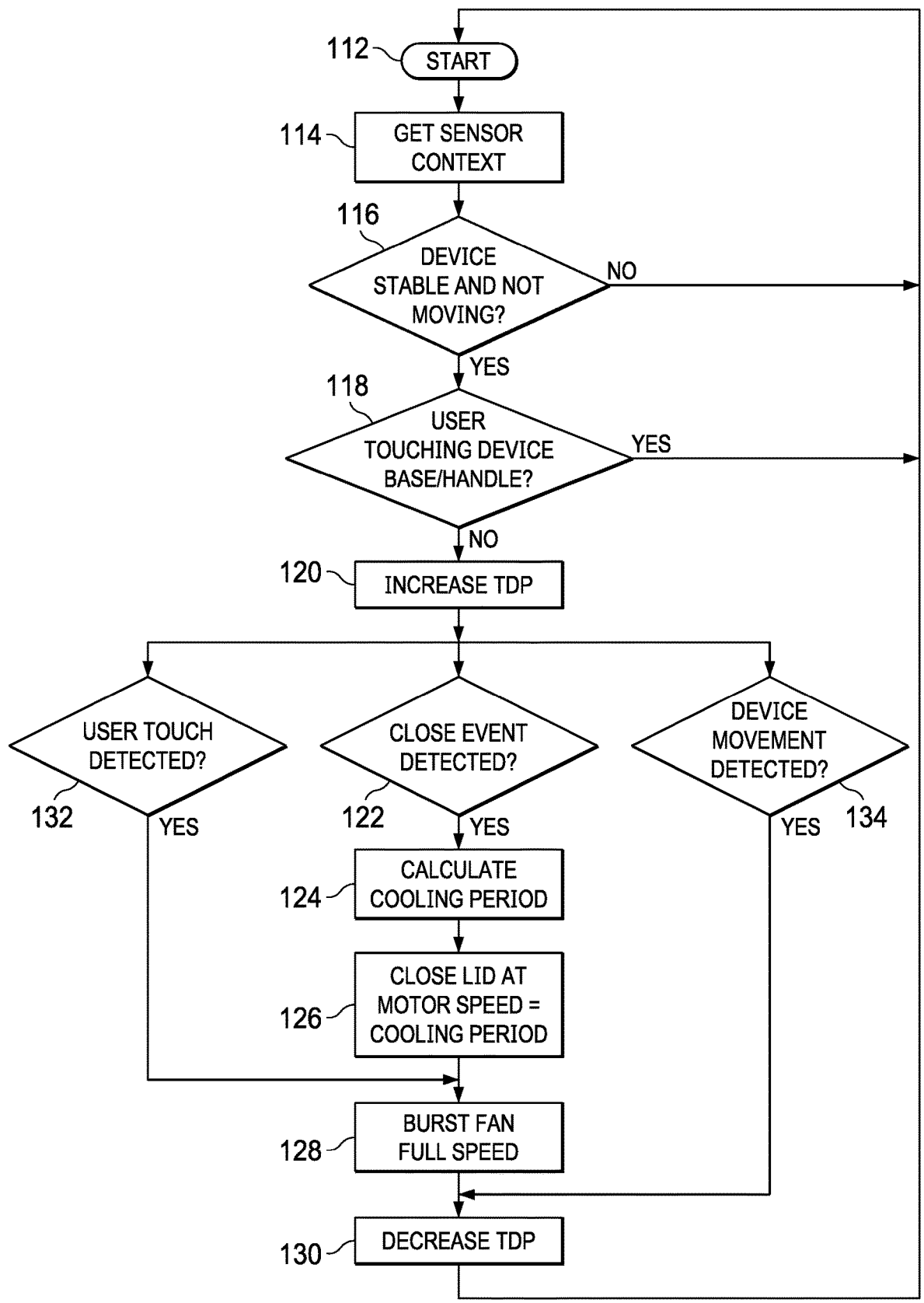
FIG. 14 depicts a flow diagram of a process for an alternative embodiment of managing thermal conditions at a portable information handling system based upon context.

Referring now to FIG. 14, a flow diagram depicts a process for an alternative embodiment of managing thermal conditions at a portable information handling system based upon context. As an example, context may be determined by the dynamic thermal manager 162 of FIG. 11 by monitoring a number of sensors, including accelerometers 168, capacitive sensor 170, housing position sensor 172, and temperature sensors 174. The process starts at step 112, such as with power up of the system, and continues to step 114 to get the system context, such as the housing rotational orientation and indications of end user touches to the system by accelerations and capacitive sensing. As step 116 a determination is made of whether the housing is stable and not moving, such as by monitoring for accelerations and for housing rotational orientation. If system movement is detected that indicates touch by an end user of the system, the process returns to step 112 to enforce parameters associated with end user contact and to continue monitoring context. If the system is stable and not moving, the process continues to step 118 to determine if there is an end user touch at the system, such as with detection of touch by a capacitive sensor at the housing surface. If an end user touch is detected, the process returns to step 112 to use surface temperature parameters for the housing that are associated with human touch. If at step 118 end user touches are not detected, the process continues to step 120 to command an increase in the thermal dynamic performance, such as setting higher temperature parameters for the exterior of the housing. At these higher temperatures, the CPU and GPU can provide greater processing capabilities without throttling to avoid over temperatures.

During increased thermal dynamic performance, housing temperatures may increase to where end user touches as the system can causes minor discomfort. If an end user changes the mode of interactions with the system, such as by picking the system up, the process seeks to reduce the external temperatures in an expedited manner where possible. To detect an end user change in operating mode, the process continues to step 122 to detect a housing closed event, step 132 to detect a housing touch event, and step 134 to detect a housing movement event. At step 122 if a housing rotation to a closed orientation is detected, the process continues to step 124 to determine a cooling down time period that the cooling fan should run in order to obtain an acceptable temperature. The cooling down time may vary based upon the temperature of the external housing, internal component temperatures, maximum available fan speed and similar factors. In one example embodiment the goal of cooling the housing may focus on cooling the carrying handle with an integrated thermal well of organic wax that has reached a liquid phase, such as reduced the temperature to the phase change temperature. The cooling period may also include a change in direction of the cooling airflow to accept air through exhaust and output the air through the cooling fan inlets. Reversing the cooling airflow helps to bring ambient temperature air across the carrying handle to provide a more rapid decrease in the carrying handle thermal state. In addition, where the cooling fans actuate separately from the housing, an actuation to align the cooling fan exhaust with the carrying handle can further increase thermal transfer from the cooling handle. Once a cooling period is determined, the process continues to step 126 to initiate closing of the housing with the motorized hinge at a rate that coincides with the cooling period so that as the housing closes the housing temperature reaches the desired parameter for end user touching. Once the lid closure starts the process continues to step 128 to burst the cooling fan at full speed. Similarly, at step 132 if an end user touch is detected the process continues to step 128 to burst the cooling fan speed so that the system temperature is cooled as rapidly as possible. At step 130 the thermal dynamic performance is decreased to maintain temperature parameters associated with end user touches at the housing. At step 134, if movement of the housing is detected, the process goes directly to step 130 to decrease the thermal dynamic performance. From step 130, the process returns to step 112 to continue monitoring to dynamically set the external temperature parameters.

Figure 15:
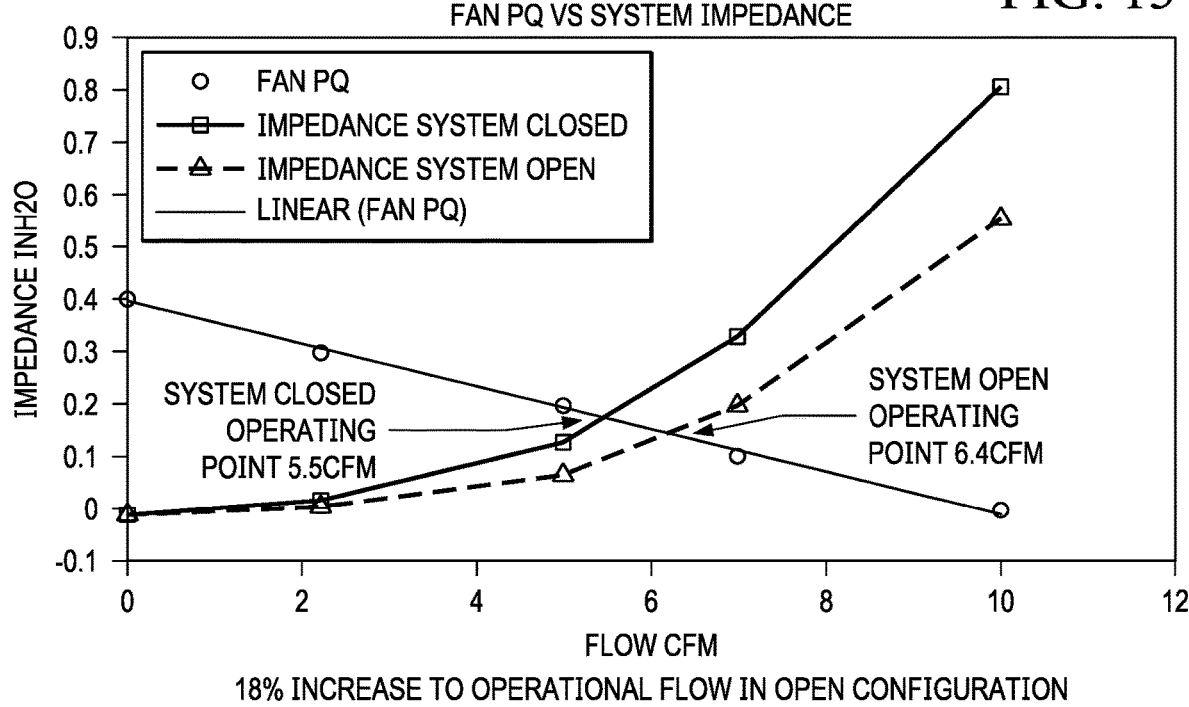
FIG. 15 depicts a chart of an example embodiment of fan pressure characteristics (PQ) vs. housing impedance in open and closed housing positions.

Referring now to FIG. 15, a chart depicts an example embodiment of fan pressure characteristics (PQ) vs. housing impedance in open and closed housing positions. With the housing closed, a greater impedance intersects the cooling fan PQ at a reduced airflow compared to the intersection of the housing impedance and fan PQ in a housing open position. In the example embodiment described above having the lowered cooling fan bay and upper circuit board set of cooling fins removed from the fan exhaust in the open position, an 18% increase is provided with the housing open compared to close. The improved airflow provides improved thermal rejection that allows processing components to operate at higher clock speeds for longer time periods.

Figure 16:
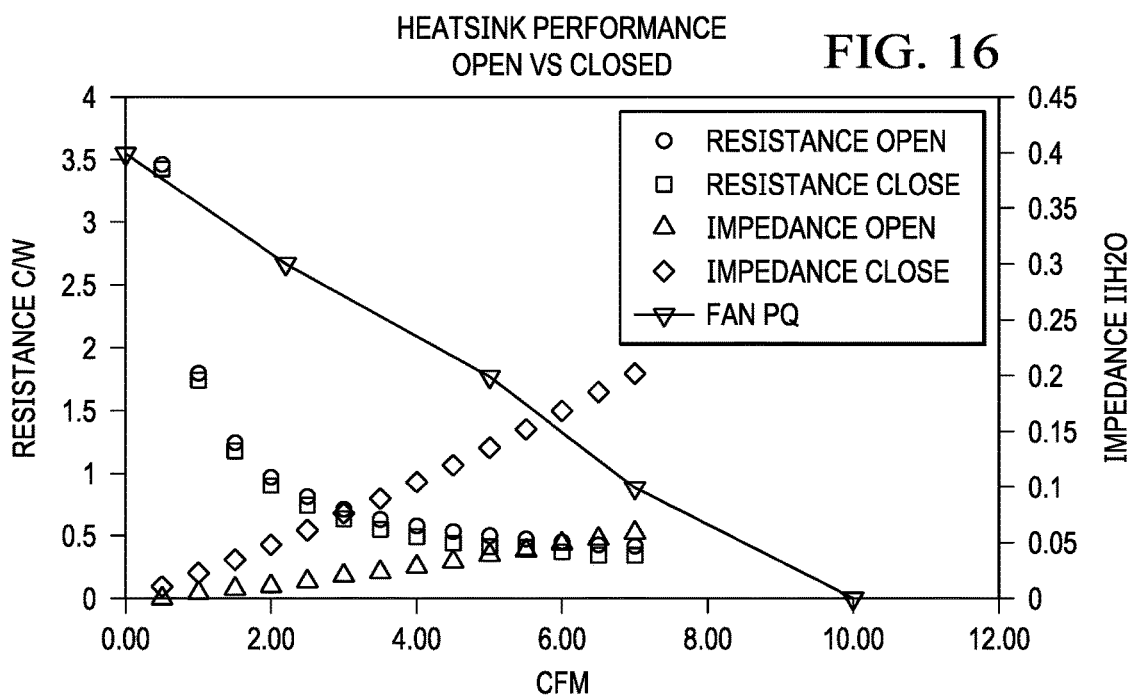
FIG. 16 depicts a chart of an example embodiment of heatsink performance in open and closed housing positions.

Referring now to FIG. 16, a chart depicts an example embodiment of heatsink performance in open and closed housing positions. Heat sink resistance in degrees Celsius per Watt is reduced with higher airflows generated by the cooling fan in the open position having the reduced impedance compared to the closed position. As is described in greater detail above, the improved performance provided by reduced impedance may be achieved with individual actuations of the cooling fan exhaust vector, the cooling fan bay and the cooling fin sets that are disposed in the cooling fan exhaust. Thus, although the performance graphs reference housing open and closed positions, a closed position may also achieve enhanced cooling with individual actuation of cooling resources.

Although the present invention has been described in detail, it should be understood that various changes, substitutions and alterations can be made hereto without departing from the spirit and scope of the invention as defined by the appended claims.

What is claimed is:

1. An information handling system comprising: a portable housing having first and second housing portions rotationally coupled to rotate between open and closed positions; a central processor unit disposed in the housing and operable to execute instructions that process information; a memory disposed in the housing and interfaced with the processor, the memory operable to store the instructions and information; a display integrated in the portable housing and operable to present the information as visual images; a graphics processor unit interfaced with the central processor unit and the display, the graphics processor operable to process the information to generate pixel values that define visual images for presentation at the display; a cooling fan disposed in the housing and operable to generate a cooling airflow to reject thermal energy from within the housing; one or more temperature sensors operable to detect a temperature associated with an exterior surface of the housing; one or more contextual sensors operable to detect a context of the housing relative to an end user; a controller interfaced with the cooling fan, the one or more temperature sensors and the one or more contextual sensors, the controller operable to adapt operating conditions to maintain a selected of plural temperature thresholds of the exterior surface of the housing based upon the context; and a motorized hinge interfaced with the controller to rotate the first and second housing portions between open and closed positions; wherein the controller adjusts a rate at which the motorized hinge closes the first and second housing portions based at least in part upon the temperature of the exterior surface of the housing.

2. The information handling system of claim 1 wherein: the controller bursts the cooling fan to generate enhanced cooling airflow for a predetermined time based at least upon the rate at which the motorized hinge closes the first and second housing portions.

3. The information handling system of claim 2 further comprising:
a carrying handle coupled to the housing; and
a heat pipe loop disposed in the handle and interfaced with the housing to reject thermal energy from within the housing to the carrying handle;
wherein the cooling fan aligns an exhaust towards the carrying handle at least during bursts of the cooling fan.

4. The information handling system of claim 3 further comprising a color coded temperature indicator integrated in the carrying handle and operable to indicate a temperature of the carrying handle.

5. The information handling system of claim 3 further comprising: an actuator interfaced with the controller and the cooling fan to adjust an alignment of an exhaust; wherein the controller manages the actuator to align the exhaust and the carrying handle during closing of the first and second housing portions to achieve at least a predetermined temperature of the carrying handle.

6. The information handling system of claim 1 wherein the one or more contextual sensors comprises a capacitive sensor disposed at the exterior surface of the housing and operable to detect a presence and absence of human contact at the housing.

7. The information handling system of claim 5 wherein the one or more contextual sensors comprises an accelerometer disposed in the housing and operable to detect motion of the housing.

8. The information handling system of claim 7 wherein the one or more contextual sensors comprises a housing position sensor operable to detect open and closed positions of the first and second housing portions.

9. A method for managing thermal conditions at an information handling system, the method comprising: detecting a context of the information handling system; based upon the context, selecting one or more temperature thresholds for a housing exterior of the information handling system; managing operations of components in the information handling system to maintain the housing exterior below the one or more temperature thresholds; and rotating a first and second housing portions of an information handling system housing between closed and open positions with a motorized hinge; wherein the managing operations further comprises adjusting the rate at which the motorized hinge closes the first and second housing portions.

10. The method of claim 9 wherein the managing operations further comprises: monitoring a temperature of a carrying handle extending from the information handling system housing; when the temperature exceeds a threshold, bursting a cooling fan to blow air across the carrying handle; and adjusting the rate at which the motorized hinge closes the first and second housing portions to achieve a predetermined temperature of the carrying handle when the first and second housing portions complete closing.

11. The method of claim 10 further comprising presenting a color coded temperature indication at the carrying handle.

12. The method of claim 11 further comprising:
transferring thermal energy from within the housing to the carrying handle with a heat pipe loop; and
storing excess thermal energy in the carrying handle by a phase change of a solid material to a liquid state.

13. The method of claim 12 wherein the managing operations further comprises:
monitoring with an accelerometer for movement of the housing;
monitoring with a capacitive sensor for human touch of the housing; and
monitoring a rotational orientation of the first and second housing portions.

14. A system for managing thermal energy at an information handling system housing, the system comprising: a thermal sensor operable to monitor a temperature of an information handling system housing exterior; one or more context sensors operable to detect a context of the housing; a cooling fan operable to generate a cooling airflow from an exhaust of the housing; a controller interfaced with the thermal sensor, the one or more context sensors and the cooling fan to command the cooling fan speed; non-transitory memory interfaced with the controller and storing instructions that when executed, the controller commands operating conditions within the housing to maintain less than a selected of plural housing exterior temperature thresholds, the housing exterior temperature threshold selected based upon the context; and a motorized hinge interfaced with the information handling system housing and the controller, the motorized hinge rotating the housing to a closed position at a rate of speed selected based upon the context.

15. The system of claim 14 further comprising a color coded light disposed at the information handling system housing exterior and interfaced with the controller, the instructions operable to illuminate a color associated with a temperature sensed at an exterior surface of the information handling system.

16. The system of claim 14 further comprising a carrying handle coupled to the housing, the thermal sensor disposed at the carrying handle to sense a temperature of the carrying handle.

17. The system of claim 16 further comprising: a heat pipe interfacing an interior housing of the information handling system and the carrying handle to transfer thermal energy to the carrying handle; and a solid material disposed in the carrying handle and operable to store thermal energy with a transition from the solid to a liquid phase.

\* \* \* \* \*